United States Patent

Sakao

[11] Patent Number: 6,166,425
[45] Date of Patent: Dec. 26, 2000

[54] SEMICONDUCTOR DEVICE HAVING A RESISTANCE ELEMENT WITH A REDUCED AREA

[75] Inventor: Masato Sakao, Tokyo, Japan

[73] Assignee: NEC Corporation, Tokyo, Japan

[21] Appl. No.: 09/116,565

[22] Filed: Jul. 16, 1998

[30] Foreign Application Priority Data

Jul. 16, 1997 [JP] Japan .................................. 9-191331

[51] Int. Cl.[7] .................................................. H01L 29/00
[52] U.S. Cl. ........................ 257/538; 257/532; 257/534; 257/381
[58] Field of Search .................................. 438/385, 238, 438/381–2, 384–6, 389, 390; 257/306, 379, 380, 381, 538, 532, 534, 536, 537

[56] References Cited

U.S. PATENT DOCUMENTS

| | | | |
|---|---|---|---|
| Re. 36,261 | 8/1999 | Chin et al. ............................ | 257/306 |
| 4,620,212 | 10/1986 | Ogasawara ............................ | 257/538 |
| 5,185,285 | 2/1993 | Hasaka .................................. | 438/385 |
| 5,424,239 | 6/1995 | Sweeney ............................... | 438/385 |
| 5,659,182 | 8/1997 | Cohen ................................... | 257/530 |
| 5,721,166 | 2/1998 | Huang et al. ......................... | 438/385 |
| 5,798,544 | 8/1998 | Ohya et al. ........................... | 257/306 |
| 5,960,303 | 9/1999 | Hill ....................................... | 438/592 |
| 5,963,491 | 10/1999 | Arimoto ............................... | 365/201 |
| 5,970,338 | 10/1999 | Tempel ................................. | 438/384 |

FOREIGN PATENT DOCUMENTS

| | | |
|---|---|---|
| 67-188864 | 11/1982 | Japan . |
| 61-51956 | 3/1986 | Japan . |
| 3-77362 | 4/1991 | Japan . |
| 6-310661 | 11/1994 | Japan . |

*Primary Examiner*—J. Carroll
*Attorney, Agent, or Firm*—Young & Thompson

[57] ABSTRACT

A semiconductor device which has a MOS transistor having a gate electrode composed of a first conductive film formed on a silicon substrate; a resistance element composed of a second conductive film formed on a field insulating film formed on the silicon substrate; and a plurality of conductive film patterns formed in parallel at predetermined intervals on the surface of the field insulating film, wherein the plurality of conductive film patterns are of the first conductive film type connected with a predetermined potential, and the top surface and side of each of the plurality of conductive film patterns are covered with an insulating film; wherein the resistance element is formed reciprocative-crossing several times in the orthogonal direction to the plurality of conductive film patterns through the insulating film on the plurality of conductive film patterns.

14 Claims, 26 Drawing Sheets

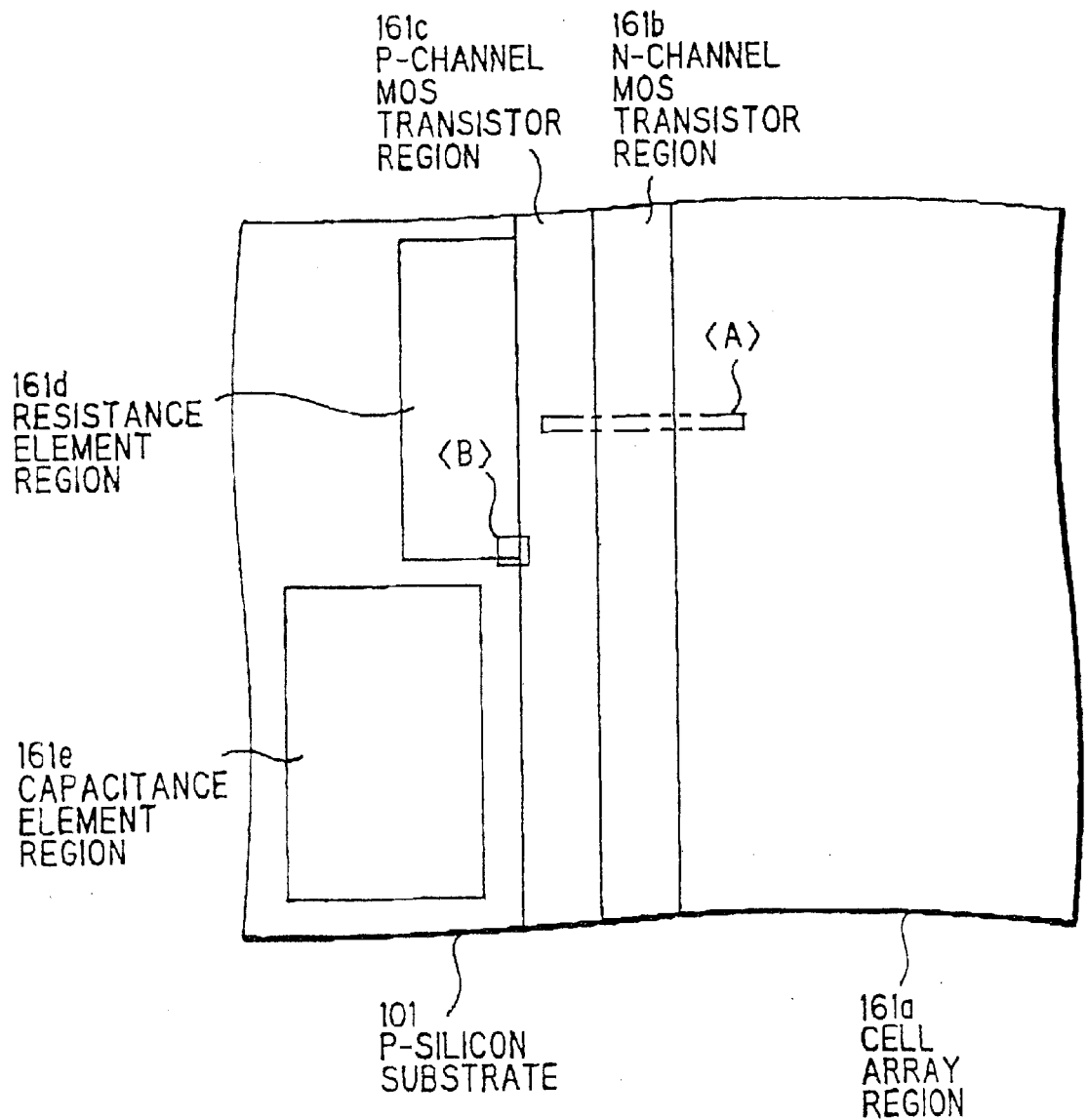

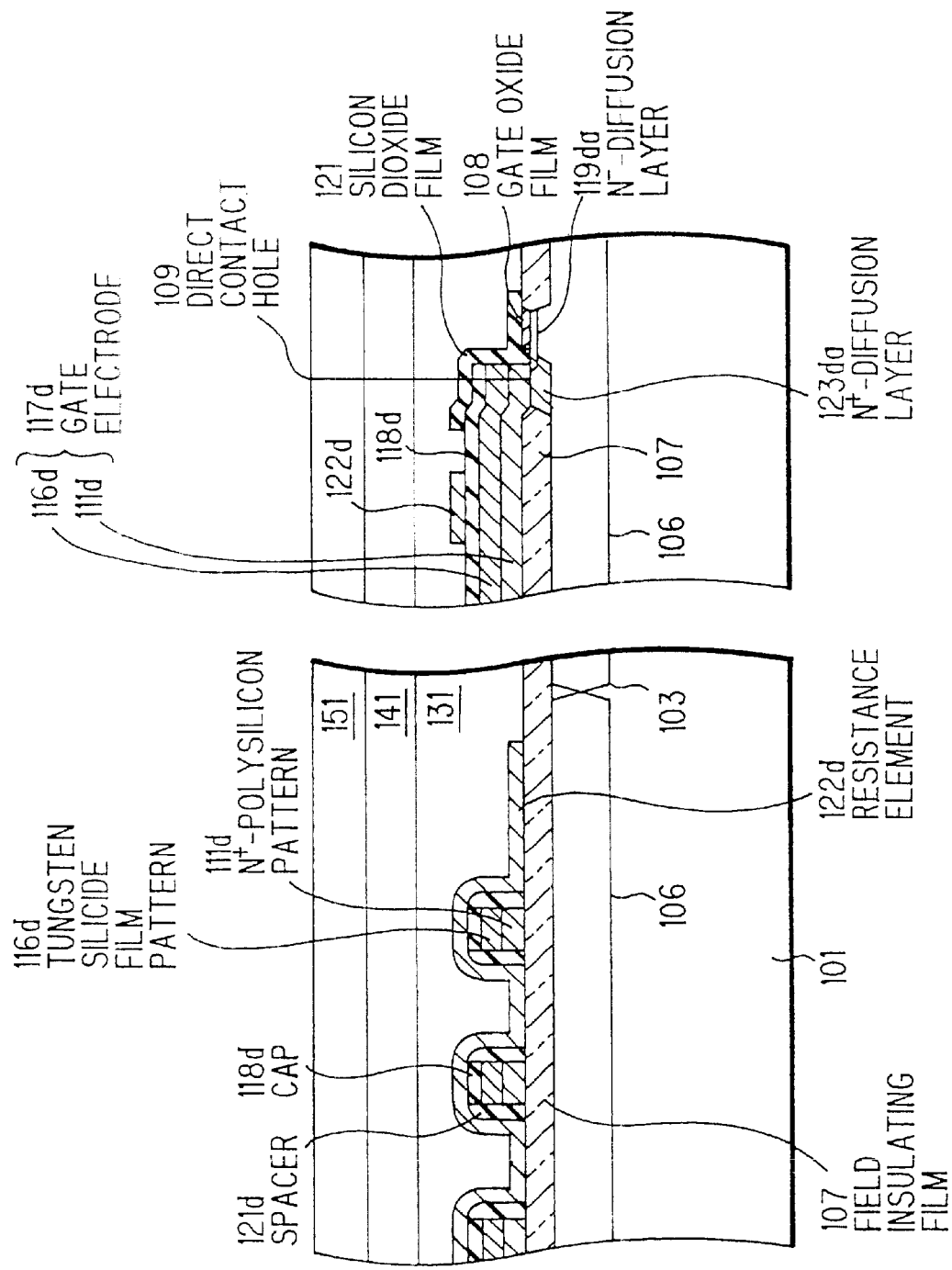

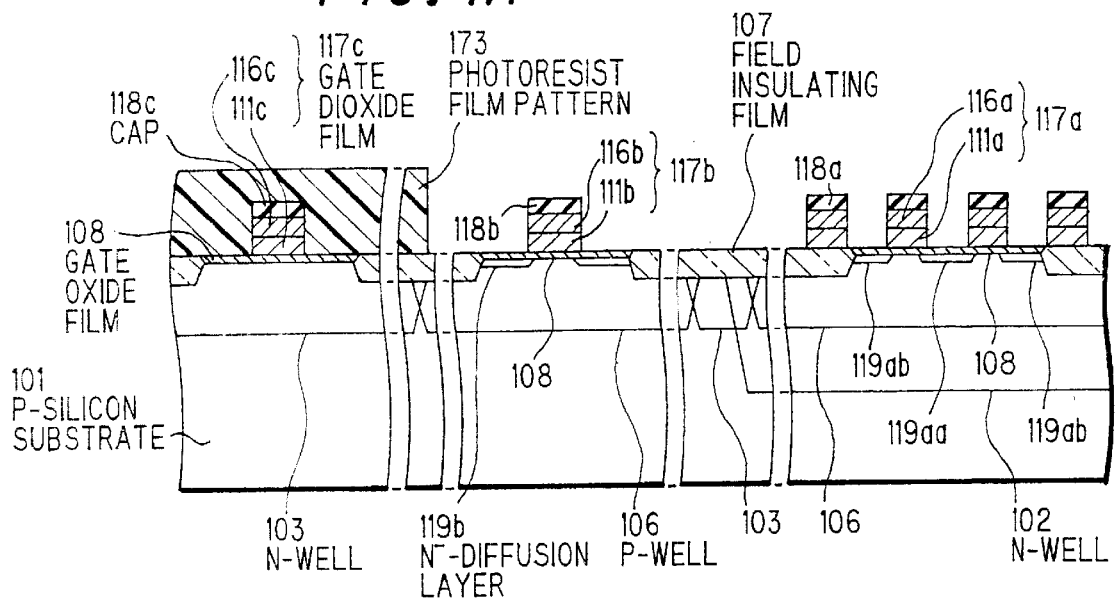
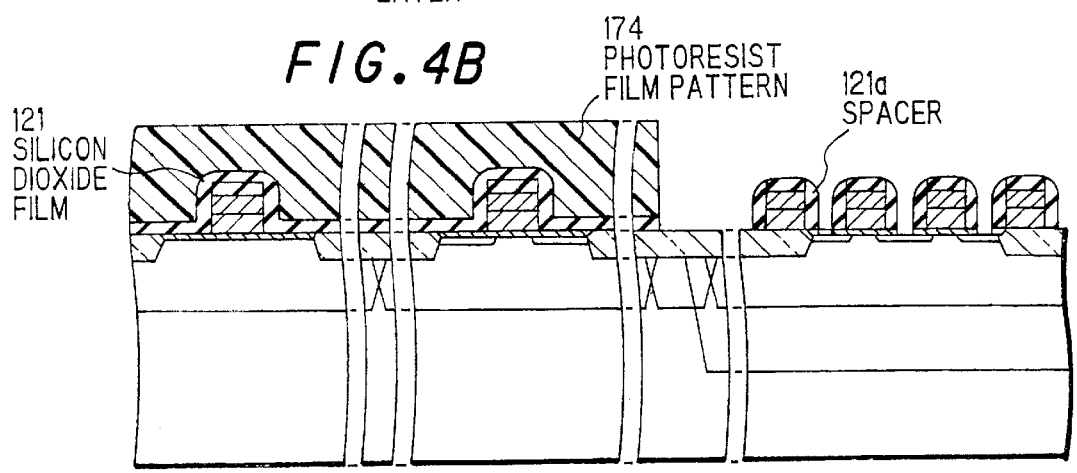
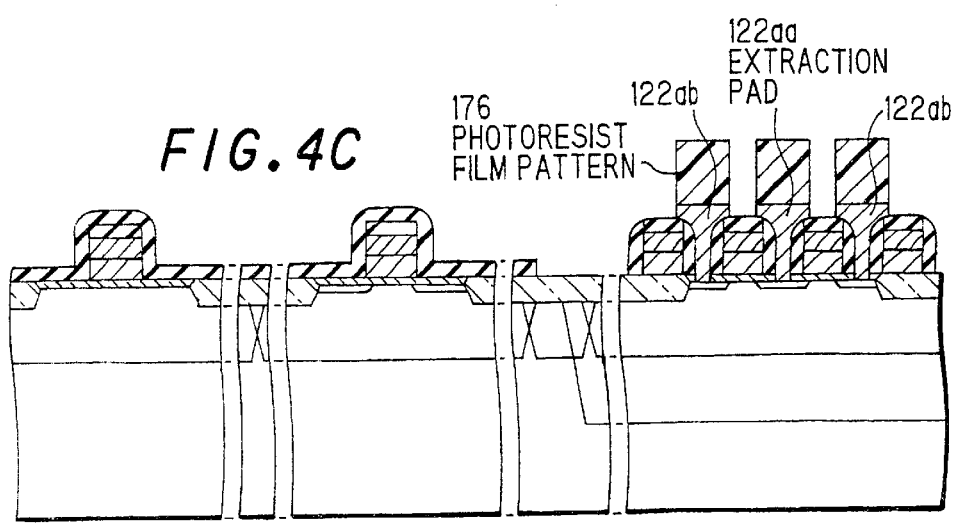

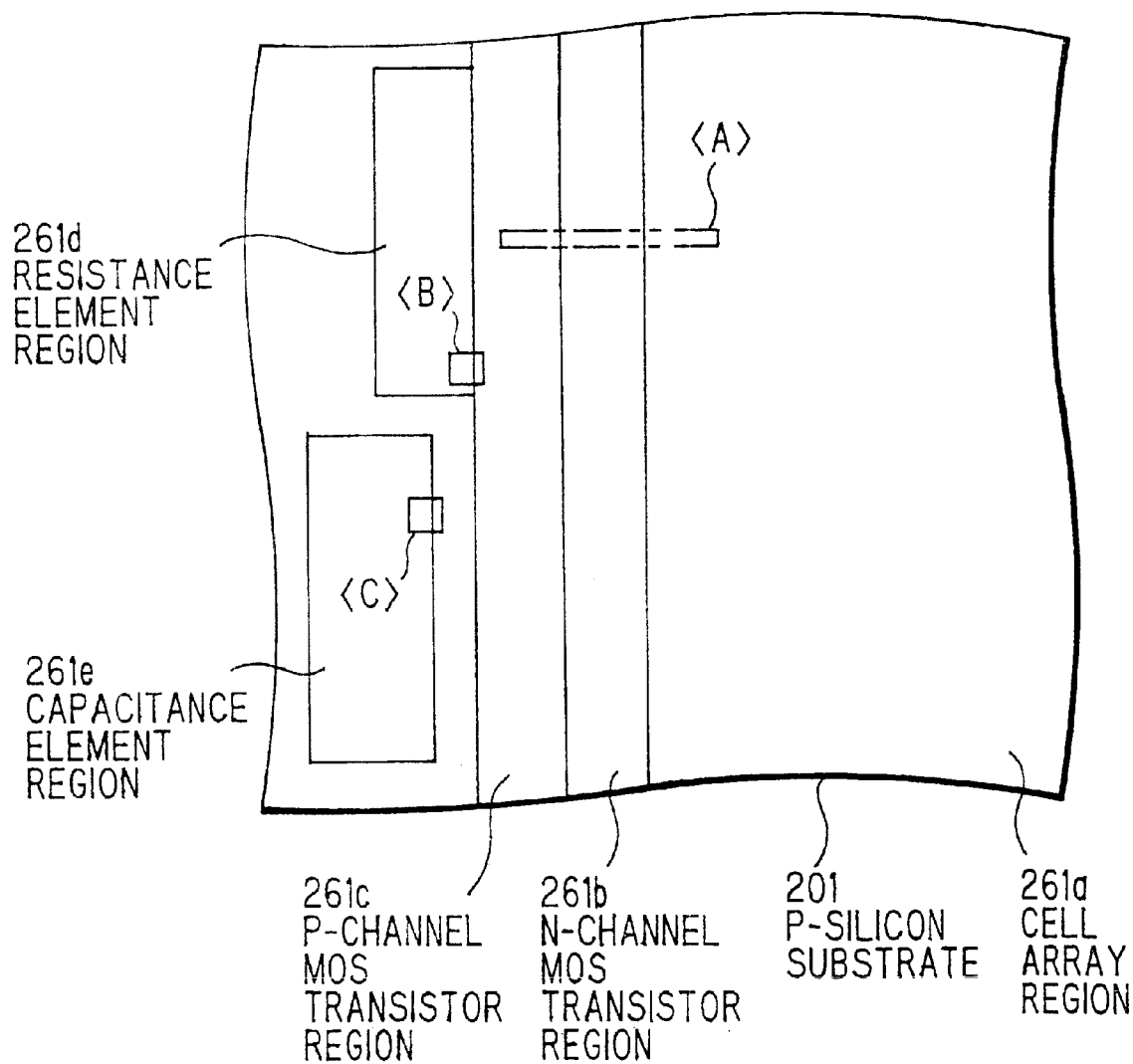

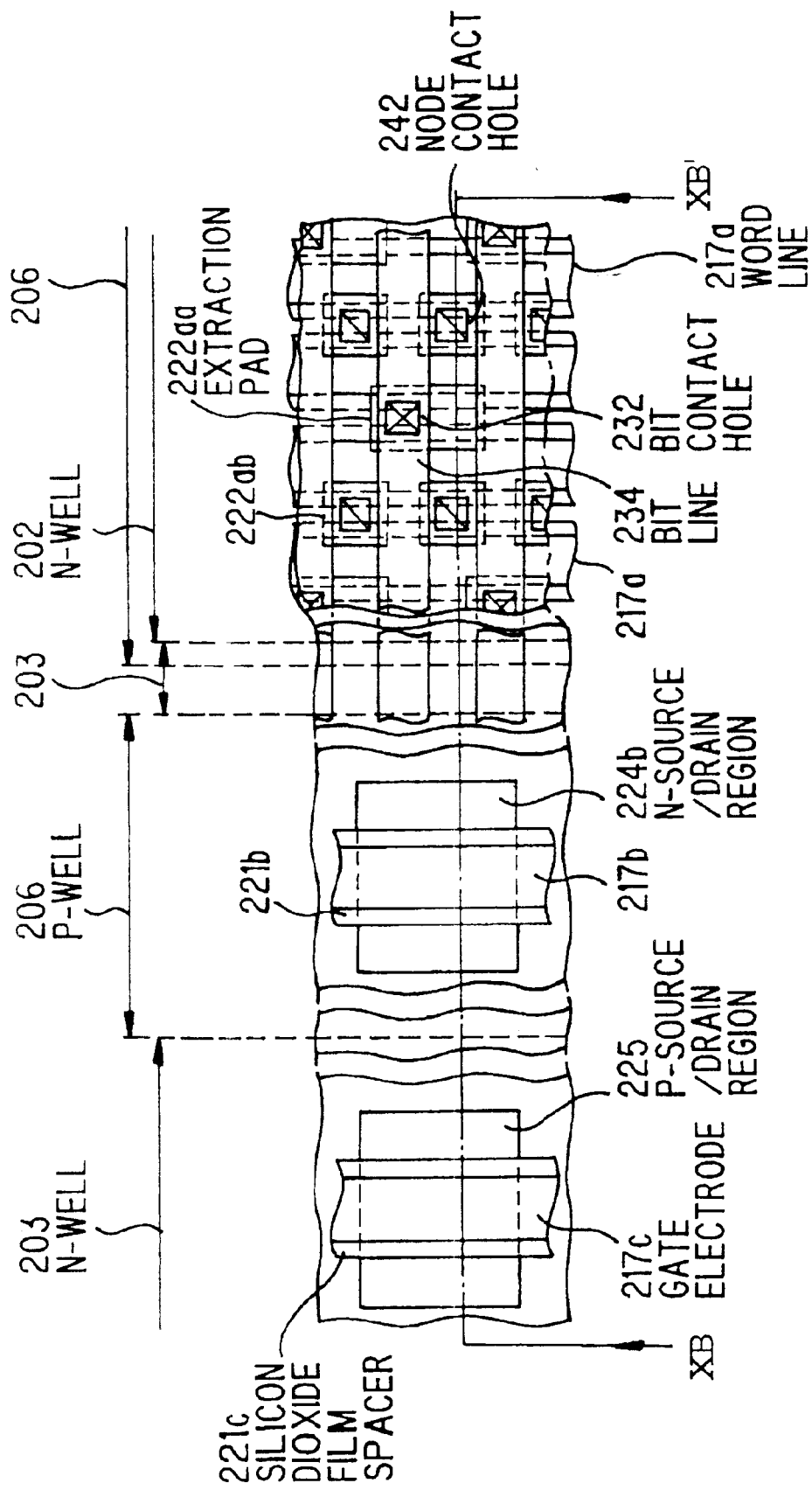

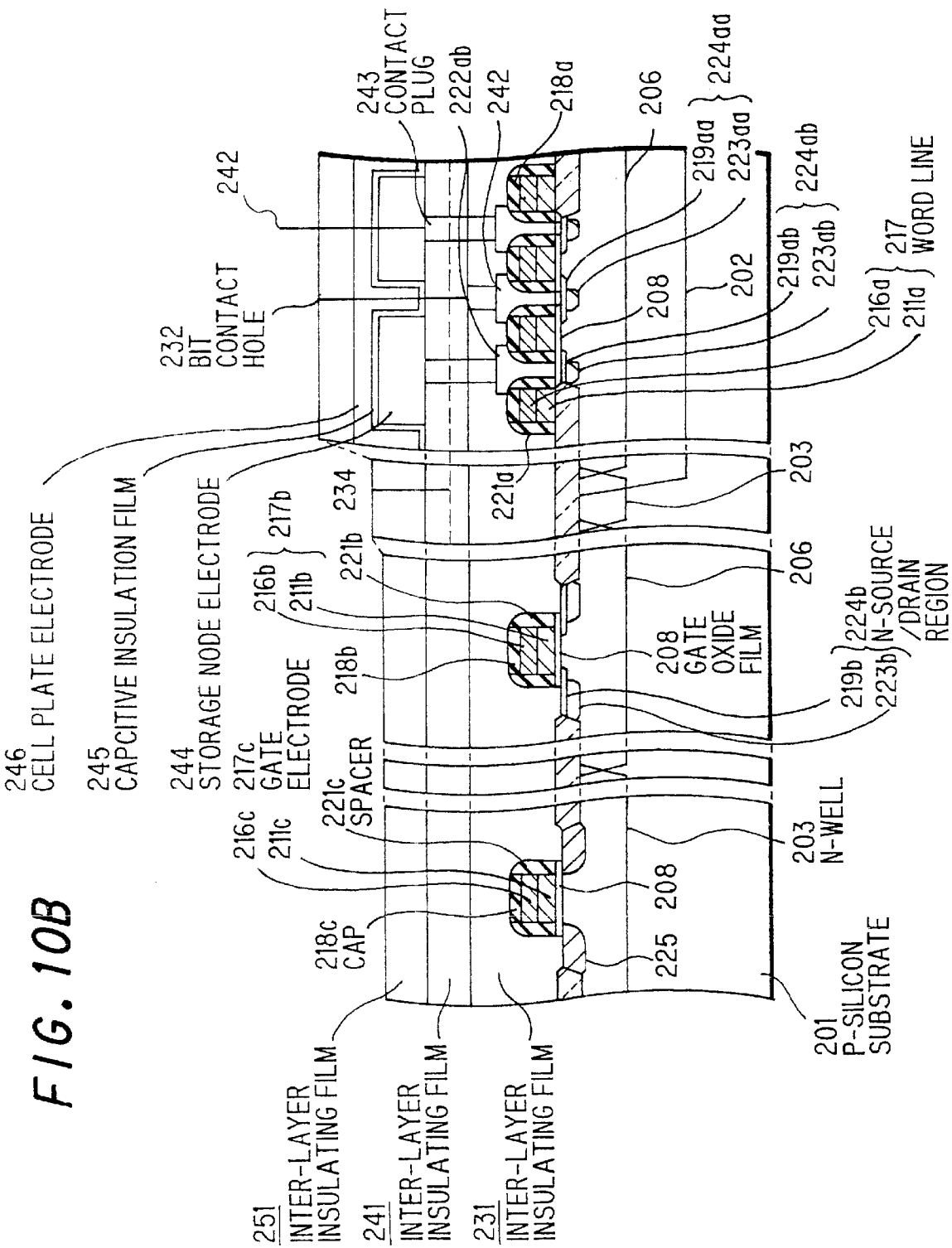

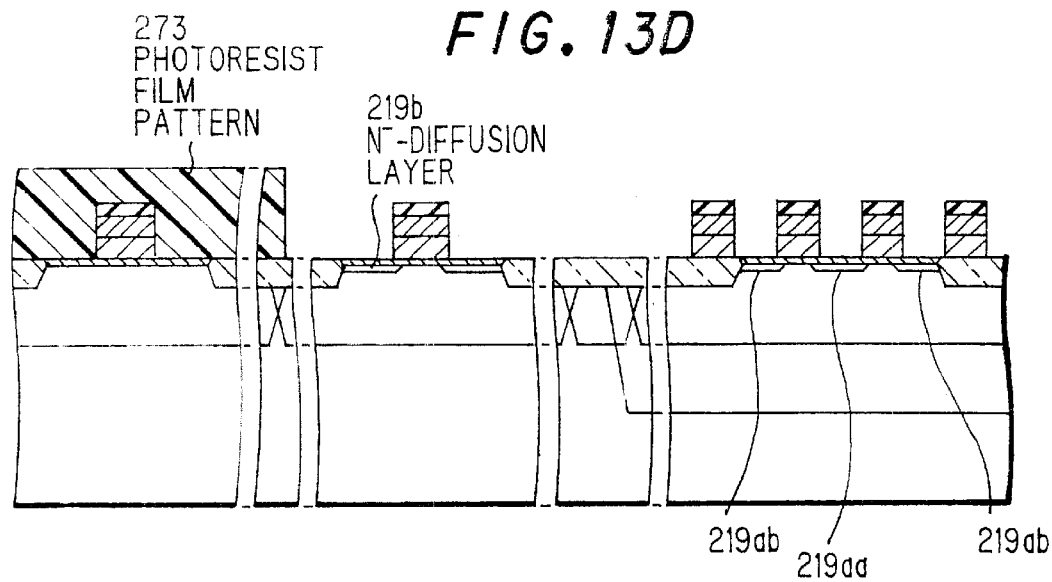
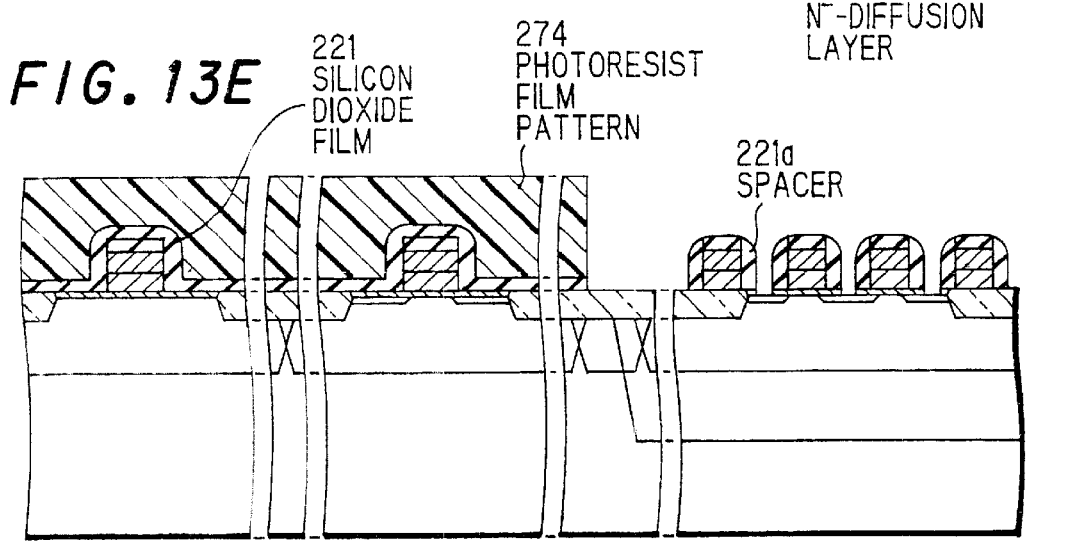
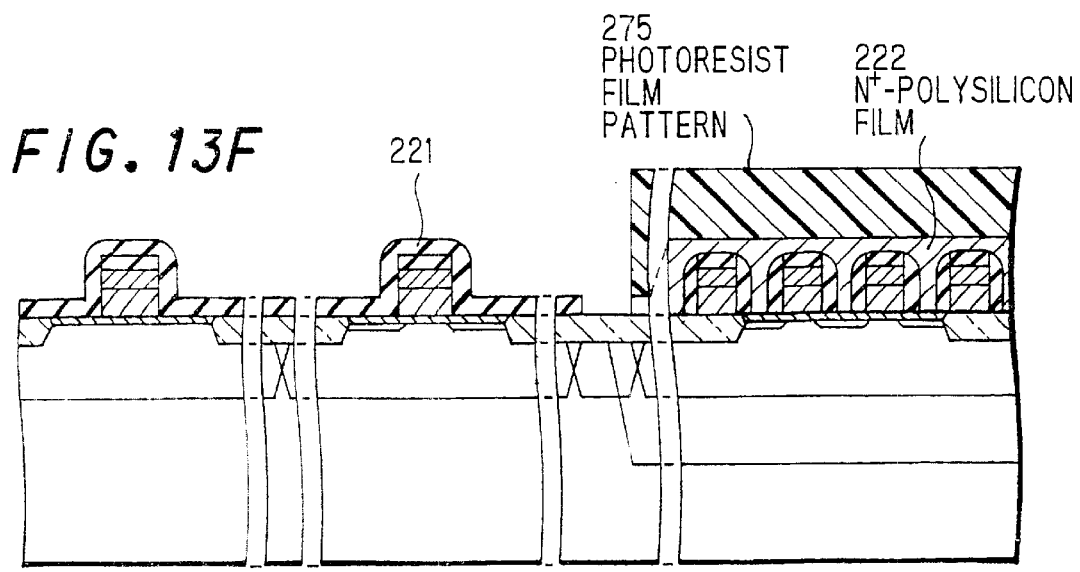

273 PHOTORESIST FILM PATTERN 215    221d SPACER

275 PHOTORESIST FILM PATTERN

222d RESISTANCE ELEMENT

276 PHOTORESIST FILM PATTERN

277 PHOTORESIST FILM PATTERN

278 PHOTORESIST FILM PATTERN

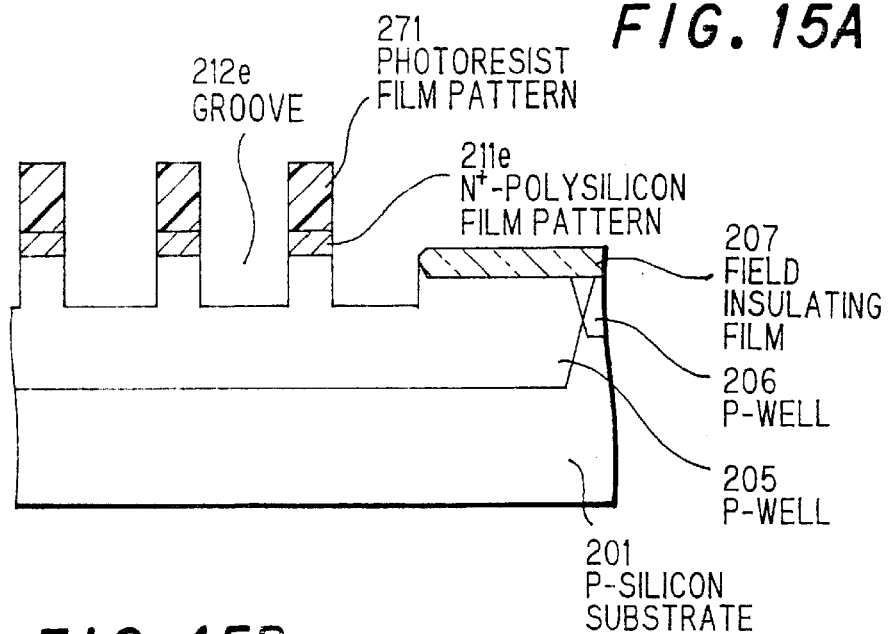
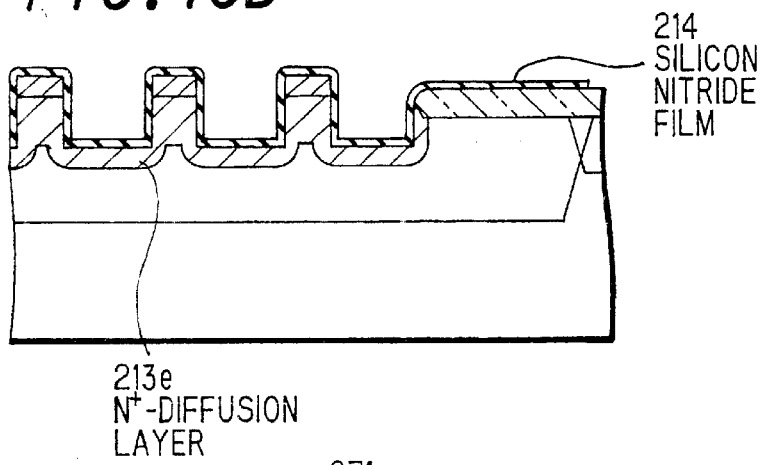
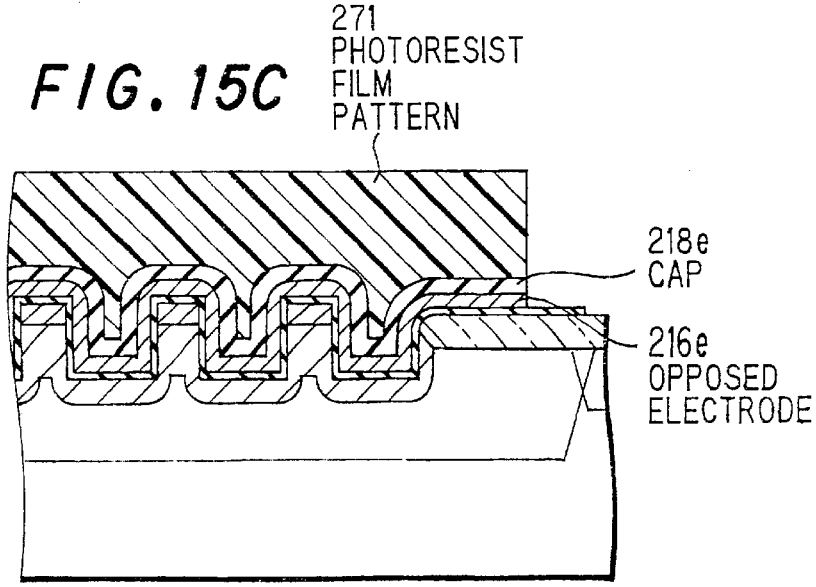

276 PHOTORESIST FILM PATTERN

277 PHOTORESIST FILM PATTERN

278 PHOTORESIST FILM PATTERN

SEMICONDUCTOR DEVICE HAVING A RESISTANCE ELEMENT WITH A REDUCED AREA

FIELD OF THE INVENTION

This invention relates to a semiconductor device including a MOS transistor and a resistance element with a large resistivity.

BACKGROUND OF THE INVENTION

When a semiconductor device including a MOS transistor comprises a constant-voltage generating circuit, a AD/DA converting circuit or the like that includes a feedback function such as voltage detection, a resistance element is needed. For such a resistance element, a high resistivity to reduce a potential variation caused by current flowing through the resistance element is necessary and further it is desirable that an error in resistivity due to a fluctuation in fabrication process be reduced. For example, a resistivity of about 1MΩ to 10MΩ is required. In a semiconductor device (including a MOS transistor) using a 0.2 μm design rule, conductive film used as a wiring material is likely to have a lowered resistivity, and the transistor gate electrode is of metal polycide film layered on $N^+$-type polysilicon film, and other lower wiring is of metal silicide film. For example, in a semiconductor device including DRAM with stacked type memory cells, a material composing cell plate electrodes has changed from N-type polysilicon film into a laminated film of, e.g., titanium nitride (TiN) film and tungsten silicide $WSi_2$ film, with employing a high-inductivity film of, e.g., tantalum oxide ($Ta_2O_5$), although its main object is not to lower the resistivity.

As a material to compose the resistance element, a second $N^+$-type polysilicon film formed on the surface of field insulating film is, in general, preferable. In this case, even when a semiconductor component such as a MOS transistor is formed using the 0.2 μm design rule, the resistance element is typically formed to have a line width of about 0.8 μm to reduce an error in resistivity due to a fluctuation in the fabrication process.

In a semiconductor device including DRAM with stacked type memory cells, to effectively reduce the aspect ratio of a bit contact hole, a node contact hole etc., an extraction pad that is directly connected to a N-type source/drain region of a MOS transistor to compose a memory cell which self-aligns to an insulating film spacer formed on the side of a word line and is connected to a bit line or a storage node electrode is provided. The extraction pad is of a second $N^+$-type polysilicon film, therefore the resistance element can be also formed of the second $N^+$-type polysilicon film. Even when such a semiconductor device including DRAM is formed using the 0.2 μm design rule, the resistance element needs to be formed to have a line width of about 0.8 μm. The thickness of the second $N^+$-type polysilicon film of the semiconductor device is 0.15 μm (150 nm) on the surface of field insulating film, but a quite thick part in the cell array region occurs since a part with no word line is filled therewith. Therefore, when the resistance element and the extraction pad are formed by using the same second $N^+$-type polysilicon film in a photolithography process, over-etching is required because the etching time for the second $N^+$-type polysilicon film of 150 nm thick cannot be used as a standard. Due to the need to avoid the overetching required to provide the resistance element with a line width of 0.2 μm, the line width of the resistance element needs to be about 0.8 μm.

Thus, in a typical semiconductor device or a semiconductor device including DRAM, the resistance element must have a quite large occupied area. For example, when a resistance element with a resistivity of 5MΩ is formed by using a second $N^+$-type polysilicon film with a thickness of about 150 nm and a layer resistance of 50Ω/□, the occupied area is as follows: For example, when the resistance element with a line width of 0.8 μm is formed repeatedly turning around in a certain direction with an interval of, e.g., 0.8 μm, the occupied area necessary for this resistance element is about 128×1000 μm².

Meanwhile, in a semiconductor device including a MOS transistor, another element with a large occupied area other than the resistance element may exist. Namely, when such a semiconductor device includes a constant-voltage generating circuit, the constant-voltage generating circuit needs to have a capacitance element with a large capacitance, such as a pumping capacitor and a compensating capacitor. The capacitance value of such a capacitance element is about $10^3$ to $10^5$ pF. Such a capacitance element is composed by, for example, connecting in parallel several N-channel MOS transistors with a gate length L/gate width W of 50 μm/50 μm, thereby having a N-type source region, a N-type drain region and a channel region (in an inverted state) in the N-channel MOS transistor as one electrode, and a gate electrode as an opposed electrode. For example, in the case of a compensating capacitance element of 3000 pF, the occupied area is 100×6100 μm², provided that the gate oxide film in the N-channel MOS transistor is 7 nm thick.

SUMMARY OF THE INVENTION

Accordingly, it is an object of the invention to provide a semiconductor device wherein the resistance element has a reduced occupied area to realize a finer-structured semiconductor device while reducing an error in resistivity due to a fluctuation in the fabrication process.

It is a further object of the invention to provide a semiconductor device wherein a capacitance element with a large capacitance value has a reduced occupied area.

According to the invention, a semiconductor device, comprising:

a MOS transistor having a gate electrode composed of a first conductive film is formed on a silicon substrate;

a resistance element composed of a second conductive film formed on a field insulating film on the silicon substrate; and a plurality of conductive film patterns formed in parallel at predetermined intervals on the surface of the field insulating film, wherein the plurality of conductive film patterns are part of the first conductive film connected with a predetermined potential, and the top surface and side of each of the plurality of conductive film patterns are covered with an insulating film;

wherein the resistance element is formed reciprocative-crossing several times in the orthogonal direction to the plurality of conductive film patterns, through the field insulating film on the plurality of conductive film patterns.

According to another aspect of the invention, a semiconductor device, comprising:

a N-channel MOS transistor formed on the surface of a first P-well formed on the surface of a P-type silicon substrate;

a P-channel MOS transistor formed on the surface of a N-well formed on the surface of the P-type silicon substrate; and a resistance element formed on the surface of a second P-well formed on the surface of the P-type silicon substrate while having a depth deeper than that of the first P-well;

wherein the N-channel MOS transistor and the P-channel MOS transistor have a gate electrode composed of a first $N^+$-type polysilicon film and a metal silicide film laminated thereon, the top surface of the gate electrode being covered with an insulating film cap of a first insulating film and the side of the gate electrode being covered with an insulating film spacer of a second insulating film;

the semiconductor device further comprises a plurality of $N^+$-type polysilicon film patterns that are composed of the first $N^+$-type polysilicon film and are formed in parallel at predetermined intervals on the second P-well while directly connecting to the surface of the second P-well, a groove with a predetermined depth formed self-alignedly to the $N^+$-type polysilicon film patterns on the second P-well, and a $N^+$-type diffusion layer is formed on the surface of the second P-well to form the surface of the groove as well as the surface of the second P-well to be directly connected to the $N^+$-type polysilicon film patterns;

the surface of the $N^-$-type polysilicon film patterns including the groove is covered with a third insulating film with a predetermined thickness; and the resistance element composed of a second $N^+$-type polysilicon film is formed reciprocative-crossing several times in the orthogonal direction to the $N^+$-type polysilicon film patterns through the third insulating film on the $N^+$-type polysilicon film patterns.

According to another aspect of the invention, a semiconductor device, comprising:

a N-channel MOS transistor formed on the surface of a first P-well formed on the surface of a P-type silicon substrate;

a P-channel MOS transistor formed on the surface of a N-well formed on the surface of the P-type silicon substrate;

a resistance element formed on the surface of a second P-well formed in a first region of the surface of the P-type silicon substrate while having a depth deeper than that of the first P-well; and a capacitance element formed on the surface of the second P-well formed in a second region of the surface of the P-type silicon substrate while having a depth deeper than that of the first P-well;

wherein the N-channel MOS transistor and the P-channel MOS transistor have a gate electrode composed of a first $N^+$-type polysilicon film and a metal silicide film laminated thereon, the top surface of the gate electrode being covered with an insulating film cap of a first insulating film and the side of the gate electrode being covered with an insulating film spacer of a second insulating film;

the semiconductor device further comprises a plurality of first $N^+$-type polysilicon film patterns that are composed of the first $N^+$-type polysilicon film and are formed in parallel at predetermined intervals on the second P-well in the first region while directly connecting to the surface of the second P-well, a first groove with a predetermined depth formed self-alignedly to the first $N^+$-type polysilicon film patterns on the second P-well, and a first $N^+$-type diffusion layer on the surface of the second P-well to form the surface of the first groove as well as the surface of the second P-well to be directly connected to the first $N^+$-type polysilicon film patterns;

the surface of the first $N^+$-type polysilicon film patterns including the first groove is covered with a third insulating film with a predetermined thickness;

the resistance element composed of a second $N^+$-type polysilicon film is formed reciprocative-crossing several times in the orthogonal direction to the first $N^+$-type polysilicon film patterns through the third insulating film on the $N^+$-type polysilicon film patterns;

the semiconductor device further comprises a plurality of second $N^+$-type polysilicon film patterns that are composed of the first $N^+$-type polysilicon film and are formed in parallel at second predetermined intervals on the second P-well in the second region while directly connecting to the surface of the second P-well, a second groove with a predetermined depth formed self-alignedly to the second $N^+$-type polysilicon film patterns on the second P-well, and a second $N^+$-type diffusion layer is formed on the surface of the second P-well to form the surface of the second groove as well as the surface of the second P-well to be directly connected to the second $N^+$-type polysilicon film patterns; and the surface of the second $N^+$-type polysilicon film patterns including the second groove is covered with a capacitive insulating film, the capacitive insulating film further being directly covered with an opposed electrode composed of the metal silicide film.

BRIEF DESCRIPTION OF THE DRAWINGS

The invention will be explained in more detail in conjunction with the appended drawings, wherein:

FIG. 1 is a partial layout diagram showing a semiconductor device in a first preferred embodiment of a first preferred form of the invention, FIG. 3B is a cross sectional view cut along the line IIIB–IIIB' in FIG. 2B, FIG. 3C is a cross sectional view cut along the line IIIC–IIIC' in FIG. 2B, FIGS. 4A to 4E are cross sectional views, illustrated along the line IIIA–IIIA' in FIG. 2A, showing a process of fabricating the semiconductor device in the first embodiment of the first form of the invention, FIG. 9 is a partial layout diagram showing a semiconductor device in a first preferred embodiment of a second preferred form of the invention, FIG. 10A is an enlarged plan view showing region A in FIG. 9, FIG. 10B is a cross sectional view cut along the line XB–XB' in FIG. 10A, FIGS. 15A to 15I are cross sectional views, illustrated along the line XIIB–XIIB' in FIG. 12A, showing a process of fabricating the semiconductor device in the first embodiment of the second form of the invention.

DESCRIPTION OF THE PREFERRED EMBODIMENTS

At first, the first preferred form of the invention will be explained below.

The first form of the invention is applied to a semiconductor device that includes a MOS transistor having a gate electrode composed of a metal polycide film including a first $N^+$-type polysilicon film. In this form, while forming in parallel several dummy gate electrodes on the surface of field insulating film and covering the top and side of the gate electrode with an insulating film cap and an insulating film spacer, one resistance element is a second $N^+$-type polysilicon film is formed reciprocative-crossing several times through the insulating film cap and insulating film spacer on the dummy gate electrode in the orthogonal directional to the dummy gate electrode. The object of the first form is to reduce the occupied area of the resistance element with a large resistance value.

Figure 2A:
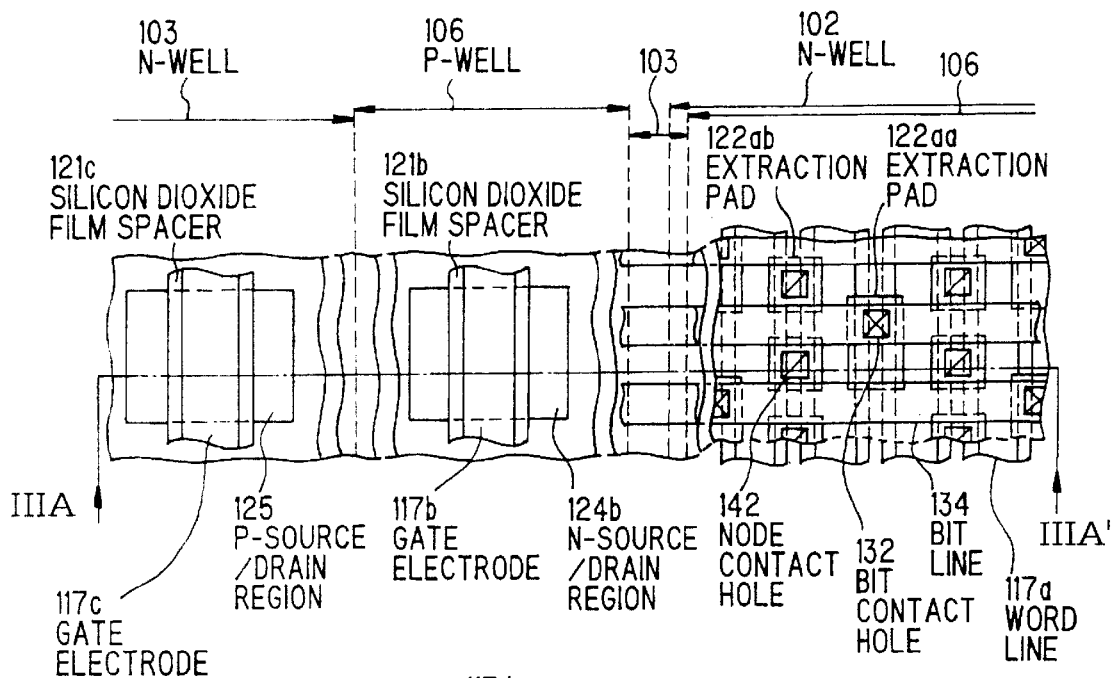
FIG. 2A is an enlarged plan view showing region A in FIG. 1.
Figure 2B:
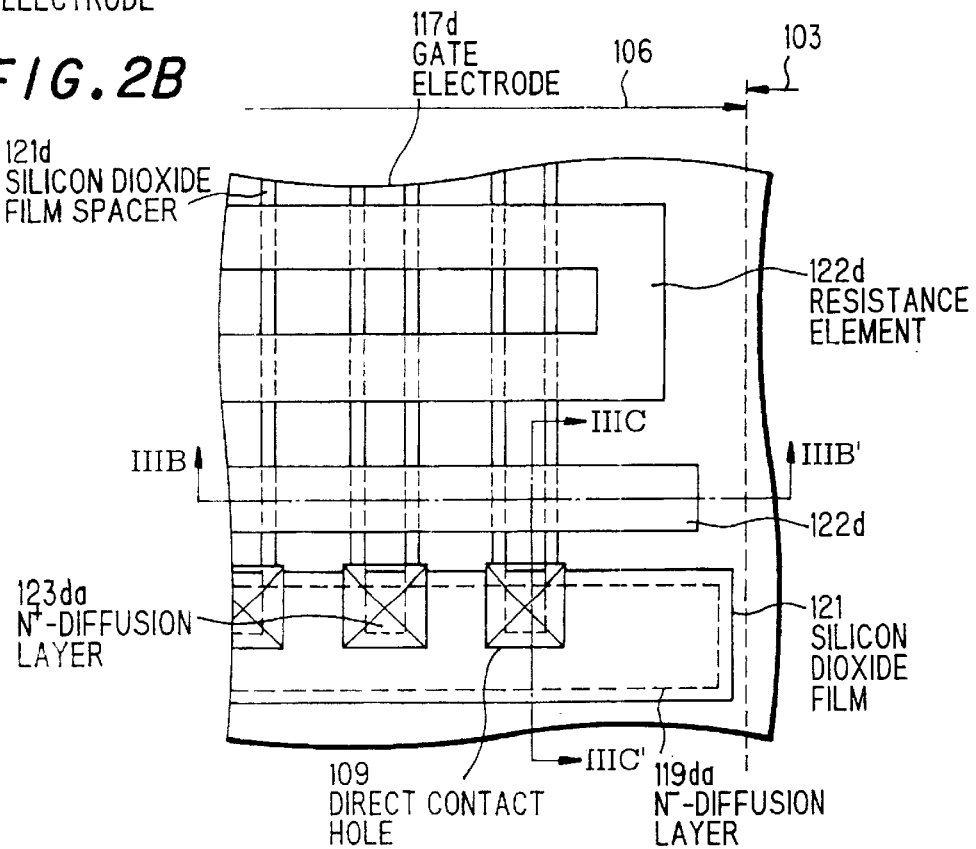
FIG. 2B is an enlarged plan view showing region B in FIG. 1.
Figure 3A:
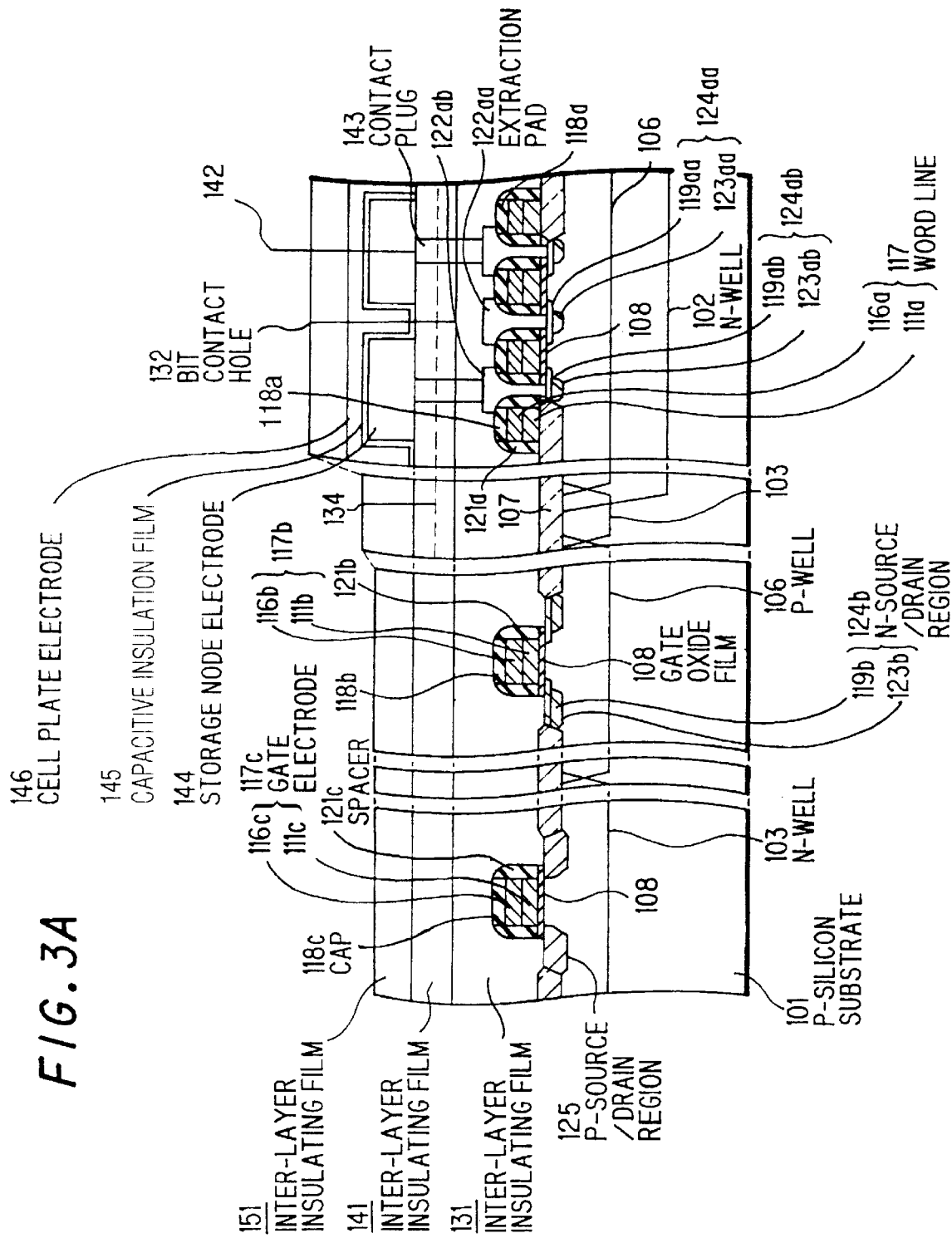
FIG. 3A is a cross sectional view cut along the line IIIA–IIIA' in FIG. 2A.
Figure 4D:
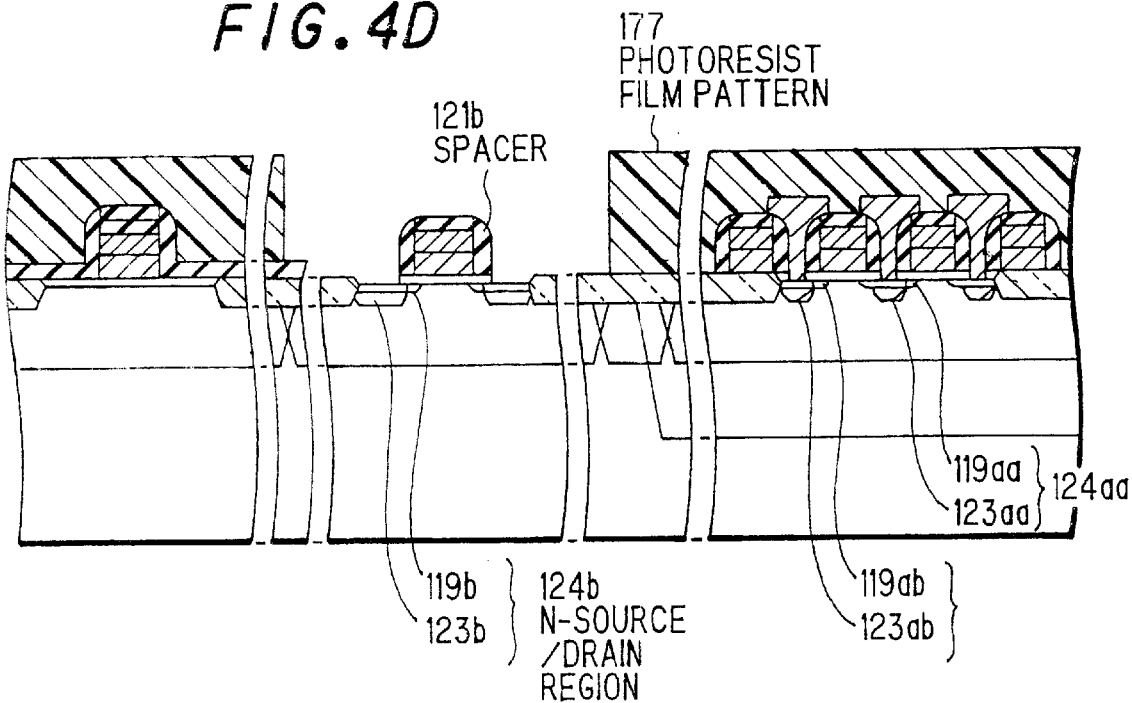
Figure 4E:
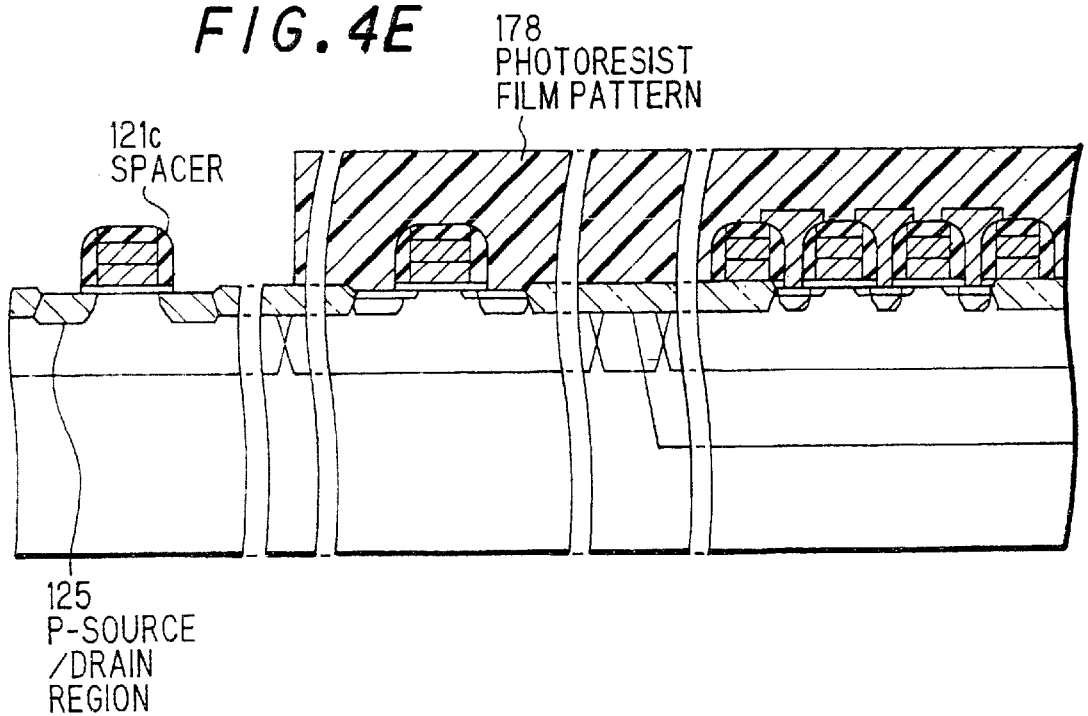
Figure 5A:
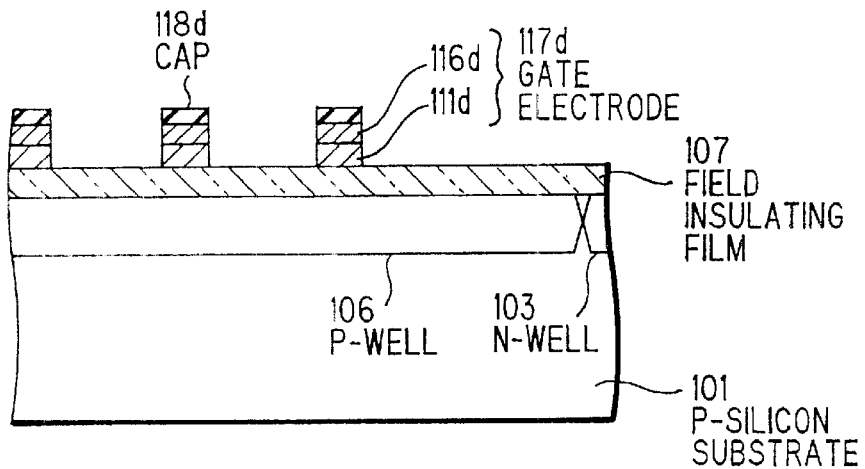
FIGS. 5A to 5E are cross sectional views, illustrated along the line IIIB–IIIB' in FIG. 2B, showing a process of fabricating the semiconductor device in the first embodiment of the first form of the invention.
Figure 5B:
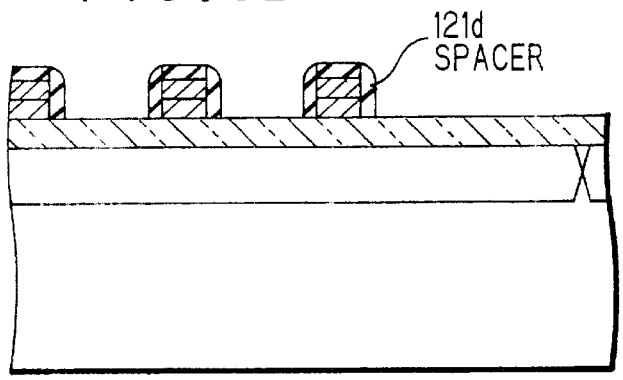
Figure 5C:
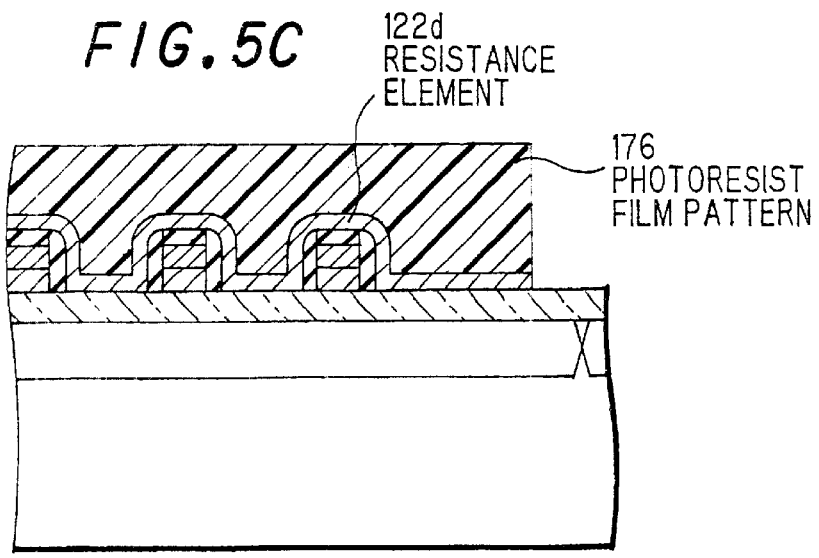
Figure 5D:
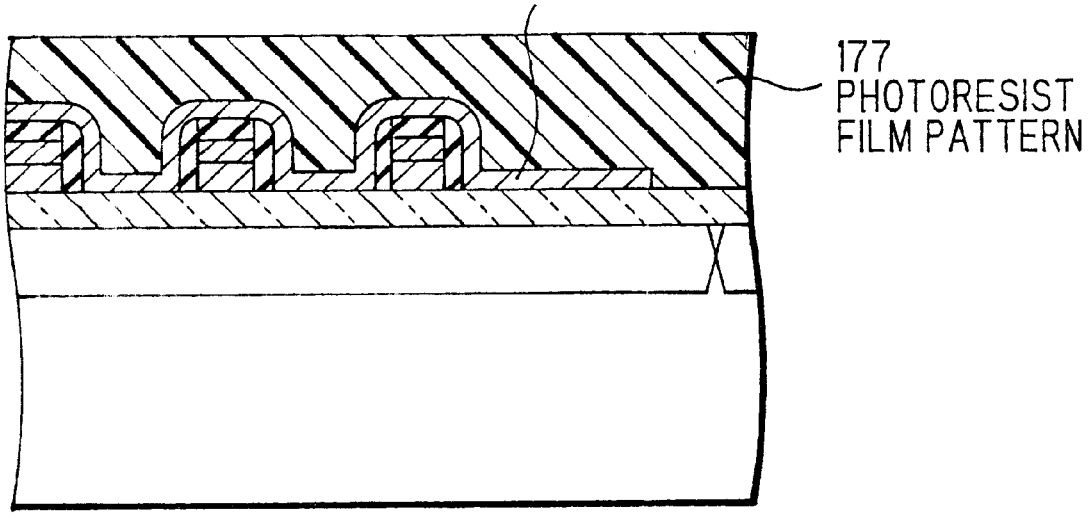
Figure 5E:
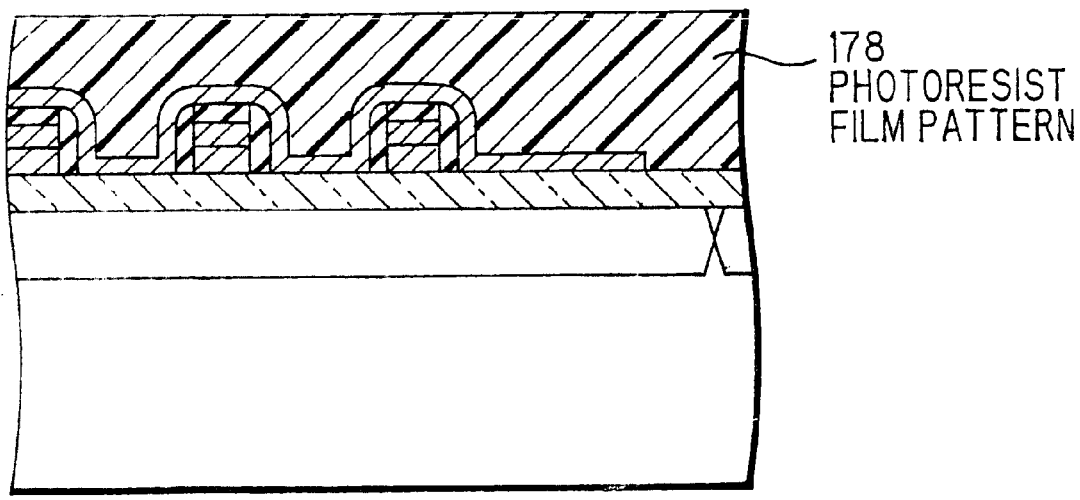
Figure 6A:
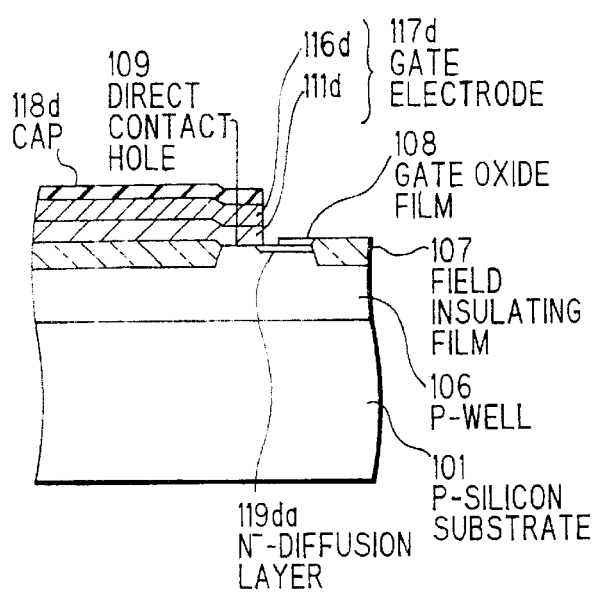
FIGS. 6A to 6E are cross sectional views, illustrated along the line IIIC–IIIC' in FIG. 2B, showing a process of fabricating the semiconductor device in the first embodiment of the first form of the invention.
Figure 6B:
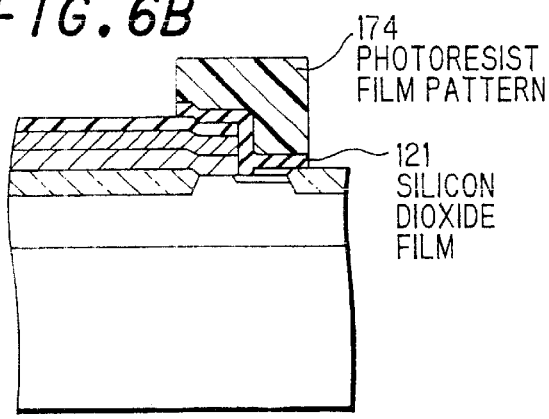
Figure 6C:
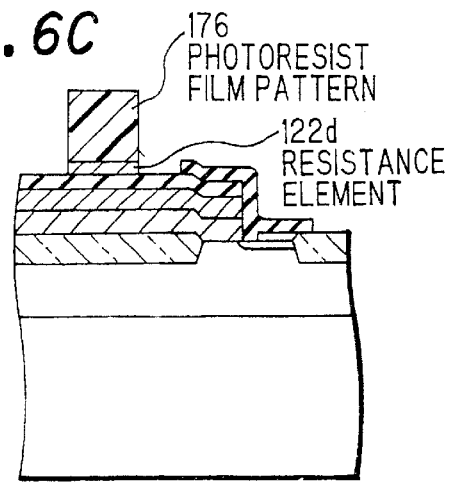
Figure 6D:
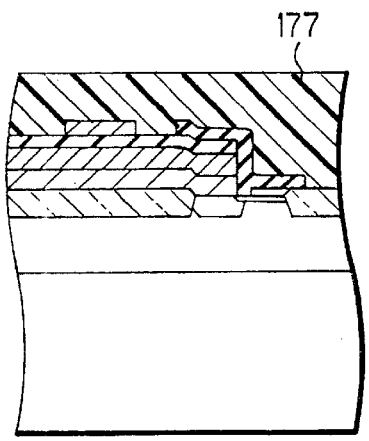
Figure 6E:
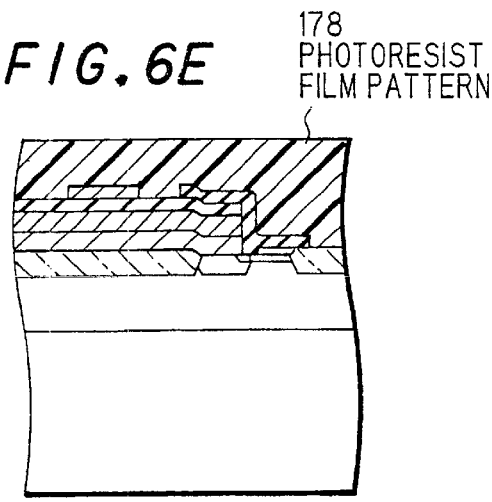

Next, referring to FIGS. 1 to 3C, a semiconductor device in the first preferred embodiment of the first form of the invention will be explained below. FIG. 1 is a partial layout diagram showing the semiconductor device in the first preferred embodiment of the first form of the invention, FIG. 2A is an enlarged schematic plan view showing a region A in FIG. 1, FIG. 2B is an enlarged schematic plan view showing a region B in FIG. 1, FIG. 3A is a schematic cross sectional view cut along the line IIIA–IIIA' in FIG. 2A, FIG. 3B is a schematic cross sectional view cut along the line IIIB–IIIB' in FIG. 2B, and FIG. 3C is a schematic cross sectional view cut along the line IIIC–IIIC' in FIG. 2B. The first embodiment of the first form is applied to a semiconductor device including DRAM with stacked type memory cells. For this semiconductor device, the 0.2 $\mu$m design rule is employed.

On the surface of a p-type silicon substrate 101, there are provided a cell array region 161a having a DRAM with stacked type memory cells, a N-channel MOS transistor region 161b having a N-channel MOS transistor, a P-channel MOS transistor region 161c having a P-channel MOS transistor, a resistance element region 161d having a resistance element with a large resistance value, and a capacitance element region 161e having a capacitance element with a large capacitance value. Further, on the surface of the p-type silicon substrate 101, there are provided a N-well 102 with a junction depth of about 7 $\mu$m, a N-well 103 with a junction depth of about 2 $\mu$m, and a P-well 106 with a depth of about 2 $\mu$m. The cell array region 161a is formed on the surface of the P-well 106 which is formed on the surface of the N-well 102, and the P-well 106 is surrounded by the N-well 103 (being device-separated from another P-well 106). The N-channel MOS transistor region 161b and the P-channel MOS transistor region 161c are formed on the surface of the P-well 106 and N-well 103, respectively. The resistance element region 161d and the capacitance element region 161e are also formed on the P-well 106. In a device-separating region on the surface of the p-type silicon substrate 101 (including the N-well 102, N-well 103 and P-well 106), a field insulating film 107 of about 250 nm thick is formed [FIGS. 1 to 3C]. Meanwhile, in the first embodiment, the N-well 102 is formed so as to give a potential different from that of the p-type silicon substrate 101 to the P-well 106 of the cell array region 161a by forming the P-well 106 on the N-well 102. Thus, the N-well 102 is not necessarily needed.

On the surface of the P-well 106 composing the cell array region 161a, there is provided a word line 117a through a gate oxide film 108 (and field insulating film 107) of about 7 nm thick. The word line 117a is composed of a $N^+$-type polysilicon film pattern 111a of first $N^+$-type polysilicon film of about 100 nm thick and a tungsten silicide film pattern 116a of tungsten silicide ($WSi_2$) film (as a metal silicide film) of about 100 nm thick to be laminated thereon. The top surface of the word line 117a is directly covered with a silicon dioxide film cap 118a (of first silicon dioxide film) of about 100 nm thick, and the side of the word line 117a (and the silicon dioxide film cap 118a) is directly covered with a silicon dioxide film spacer 121a (of second silicon dioxide film) of about 60 nm thick. The line width (gate length L), interval and wiring pitch of the word line 117a are about 0.25 $\mu$m, about 0.2 $\mu$m and about 0.45 $\mu$m, respectively. On the surface of the P-well 106 surrounded by the field insulating film 107 in the cell array 161a, there are provided $N^+$-type diffusion layers 119aa, 119ab with a junction depth of about 0.1 $\mu$m self-alignedly to the word line 117a and $N^+$-type diffusion layers 123aa, 123ab with a junction depth of about 0.15 $\mu$m self-alignedly to the silicon dioxide film, cap 118a. The N- channel MOS transistor composing the memory cell comprises the gate oxide film 108, the word line 117a, a N-type source/drain region 124aa composed of the $N^-$-type diffusion layer 119aa and $N^+$-type diffusion layer 123aa, and a N-type source/drain region 124ab composed of the $N^+$-type diffusion layer 119ab and $N^+$-type diffusion layer 123ab. The line width (gate width W) and interval of the N-type source/drain regions 124*aa*, 124*ab* are about 0.2 μm and about 0.25 μm, respectively.

Extraction pads 122*aa*, 122*ab* of second N⁺-type polysilicon film of about 150 nm thick are directly connected to the N-type source/drain regions 124*aa* and 124*ab*, respectively. The extraction pads 122*aa*, 122*ab* are formed self-alignedly to the silicon dioxide film spacer 121*a*, and the minimum width and minimum interval of the extraction pads 122*aa*, 122*ab* are about 0.25 μm and about 0.2 μm, respectively. The N-channel MOS transistor composing the memory cell, the extraction pads 122*aa*, 122*ab* etc. are covered with (first) interlayer insulating film 131. A bit contact hole 132 reaching to the extraction pad 122*aa* is formed through the interlayer insulating film 131. The diameter of the bit contact hole is about 0.2 μm. A bit line 134 of (second tungsten silicide film is provided on the surface of the interlayer insulating film 131. The bit line 134 is electrically connected through the bit contact hole 132 to the extraction pad 122*aa* and N-type source/drain region 124*aa*.

The surface of the interlayer insulating film 131 is covered with (second) interlayer insulating film 141. A node contact hole 142 formed penetrating through the interlayer insulating films 141 and 131 are reaching to the extraction pad 122*ab*. The node contact hole 142 is filled with a contact plug 143 of conductive film, and the diameter of the node contact hole 142 is also about 0.2 μm. A storage node electrode 144 formed on the surface of the interlayer insulating film 141 is connected through the contact plus 143 to the extraction pad 122*ab* and N-type source/drain region 124*ab*. The width and interval of the storage node electrode 144 are about 0.2 μm, respectively. The storage node electrode 144 is of a N⁺-type polysilicon film pattern of about 0.9 μm thick, and the top surface and side of the storage node electrode 144 are directly covered with capacitive insulating film 145 of very thin silicon nitride film and tantalum oxide (Ta₂O₅) film. The capacitive insulating film 145 has a silicon-dioxide-film-converted thickness of about 3 nm. The storage node electrode 144 and the capacitive insulating film 145 are covered with a cell plate electrode 146. The cell plate electrode 146 is composed of a titanium nitride (TiN) film of about 100 nm thick and tungsten silicide (WSi₂) film of about 100 nm thick laminated thereon. The surface of the cell plate electrode 146 is covered with (third) interlayer insulating film 151 [FIGS. 1, 2A and 3A].

On the p-well 106 and the N-well 103 composing the N-channel MOS transistor 161*b* and P-channel MOS transistor 161*c*, respectively, gate electrodes 117*b* and 117*c* are formed through the gate oxide film 108 etc. The gate electrodes 117*b* and 117*c* also comprise N⁺-type polysilicon film patterns 111*b*, 111*c* of the first N⁺-type polysilicon film of about 100 nm thick and tungsten silicide film patterns 116*b*, 116*c* of tungsten silicide (Wsi₂) film (as a metal silicide film) of about 100 nm thick to be laminated thereon. The top surfaces of the gate electrodes 117*b*, 117*c* are directly covered with silicon dioxide film caps 118*b*, 118*c* (of the first silicon dioxide film) of about 100 nm thick. Also, the sides of the gate electrode 117*b* (and silicon dioxide film cap 118*b*) and gate electrode 117*c* (and silicon dioxide film cap 118*c*) are directly covered with silicon dioxide film spacers 121*b*, 121*c*, respectively (of the second silicon dioxide film) of about 60 nm thick. The gate length L of the gate electrode 117*b* is about 0.3 μm, and the gate length L of the gate electrode 117*c* is about 0.35 μm.

On the surface of the P-well 106 surrounded by the field insulating film 107 in the N-channel MOS transistor region 161*b*, a N⁺-type diffusion layer 119*b* with a junction depth of about 0.1 μm is formed self-alignedly to the gate electrode 117*b* and a N⁺-type diffusion layer 123*b* with a junction depth of about 0.2 μm is formed self-alignedly to the silicon dioxide film spacer 121*b*. The N-channel MOS transistor formed in the N-channel MOS transistor region 161*b* comprises the gate oxide film 108, the gate electrode 117*b*, and a N-type source/drain region 124*b* composed of the N⁺-type diffusion layer 119*b* and the N⁺-type diffusion layer 123*b*. Also, on the surface of the N-well 103 surrounded by the field insulating film 107 in the P-channel MOS transistor region 161*c*, a P-type source/drain region 125 of P⁺-type diffusion layer with a junction depth of about 0.2 μm is formed self-alignedly to the silicon dioxide film spacer 121*c*. The P-channel MOS transistor formed in the P-channel MOS transistor region 161*c* comprises the gate oxide film 108, the gate electrode 117*c*, and the P-type source/drain region 125 of P⁺-type diffusion layer. The surface of the N-channel MOS transistor region 161*b* and P-channel MOS transistor region 161*c* including the N-channel MOS transistor and P-channel MOS transistor is covered with the interlayer insulating film 131. Also, in these regions, the surface of the interlayer insulating film 131 is covered with the interlayer insulating film 141, and further the surface of the interlayer insulating film 141 is covered with the interlayer insulating film 151 [FIGS. 1, 2A and 3A].

Next, on the surface of the P-well 106 in the resistance element region 161*d*, several dummy gate electrodes 117*d* with a line width (gate length L) of about 0.2 μm are formed in parallel at required intervals of, e.g., 0.5 μm through the field insulating film 107. The wiring pitch of the gate electrode 117*d* is about 0.7 μm. The gate electrode 117*d* also comprises a N⁺-type polysilicon pattern 111*d* of about 100 nm thick and a tungsten silicide film pattern 116*d* of about 100 nm thick laminated thereon. The top surface of the gate electrode 117*d* is also directly covered with a silicon dioxide film cap 118*d* of about 100 nm thick, and the side (except one end of gate electrode 117*d*) of the gate electrode 117*d* (and silicon dioxide film cap 118*d*) is also directly covered with a silicon dioxide film spacer 121*d* of about 60 nm thick.

On one end (locating at respective ends of the gate electrodes 117*d*) of the resistance element region 161*d*, there is provided a device-forming region surrounded by the field insulating film 107. A direct contact hole 109 is formed through the gate oxide film 108 formed on the surface of the device-forming region, and the gate electrode 117*d* is directly connected through the direct contact hole 109 to the surface of the P-well 106. On the surface of the P-well composing the device-forming region, there are provided a N⁺-type diffusion layer 123*da* with a junction depth of about 0.15 μm under the gate electrode 117*d* and a N⁻-type diffusion layer 119*da* with a junction depth of about 0.1 μm self-alignedly to the gate electrode 117*d*. The N⁻-type diffusion layer 119*da* and the N⁺-type diffusion layer 123*da* are directly connected with each other, and the N⁻-type diffusion layer 119*da* is connected to a fixed potential at a certain part (not shown). Further, second silicon dioxide film 121 composing the silicon dioxide film spacer 121*d* is left covering the surface of the device-forming region.

On the surface of the field insulating film 107 formed on the surface of the resistance element region 161*d*, the resistance element 122*d* of a N⁺-type diffusion layer pattern, which is the same layer as the second N⁺-type polysilicon film of about 150 nm thick to compose the extraction pad 122*aa* etc., is formed through the silicon dioxide film 118*d* and silicon dioxide film spacer 121*d* on the gate electrodes 117*d*, while reciprocative-crossing several times in the orthogonal direction of the gate electrodes 117d. The line width and interval of the resistance element 122d are about 0.8 μm and about 0.8 μm, respectively. The surface of the resistance element region 161d including the resistance element 122d is covered with the interlayer insulating film 131. Further, the surface of the interlayer insulating film 131 is covered with the interlayer insulating film 141, and further the surface of the interlayer insulating film 141 is covered with the interlayer insulating film 151 [FIGS. 1, 2B 3B and 3C].

Meanwhile, in the first embodiment of the first form of the invention, connecting electrically the gate electrode 117d to the N$^-$-type diffusion layer 119da and N$^+$-type diffusion layer 123da formed in the device-forming region is aimed to prevent the potential of the gate electrode 117d from being in a floating state. Thereby, variation in the parasitic capacitance between the gate electrode 117d and the resistance element 122d can be suppressed.

A capacitance element provided in the capacitance element region 161e has the same composition as that of conventional capacitance elements. In the first embodiment of the first form of the invention, the composition of the memory cell, N-channel MOS transistor and P-channel MOS transistor is detailed because the formation of resistance element 122d is related to that of the memory cell, the N-channel MOS transistor in the N-channel MOS transistor region 161b, and the P-channel MOS transistor in the P-channel MOS transistor region 161c. However, in the first embodiment, the formation of the resistance element 122d is little related to that of the capacitance element in the capacitance element region 161e. Therefore, the explanation as to the composition of the capacitance element is omitted.

The effects of the semiconductor device in the first embodiment of the first form of the invention will be explained below.

For example, in the conventional semiconductor device, as mentioned earlier, when a resistance element with a resistivity of 5MΩ is formed by using a second N$^+$-type polysilicon film with a thickness of about 150 nm and a layer resistance of 50Ω/□, the occupied area necessary for this resistance element is about 128×1000 μm$^2$. In the first embodiment of the first form of the invention, the effective length of the resistance element 122d crossing on one wiring pitch of the "dummy" gate electrode 117d is about 1.7 μm, therefore the occupied area necessary for a resistance element of 5MΩ is about 75×1000 μm$^2$ (being reduced to about 7/12 of that required for the conventional resistance element). The reduction ratio in occupied area of the resistance element depends upon the thicknesses of the gate electrode, silicon dioxide film cap, silicon dioxide film spacer and resistance element (of second N$^+$-type diffusion layer). For example, when the silicon dioxide film cap 118d (and 118a to 118c) is thickened, the occupied area of the resistance element 122d can be further reduced. The required interval of the gate electrode 117b being set to be 0.5 μm in the first embodiment of the first form depends upon the silicon dioxide film spacer 121d being about 60 nm thick, and the resistance element 122d being about 150 nm thick. If the interval is set to be about 0.45 μm, then the occupied area may be greater than that of conventional resistance element.

Meanwhile, the first form of the invention is not limited to a semiconductor device including DRAM with stacked type memory cells and a semiconductor device fabricated along the 0.2 μm design rule. Also, the metal silicide film, insulating film cap and insulating film spacer composing the metal polycide film are not limited to the tungsten silicide film, silicon dioxide film cap and silicon dioxide film spacer. For example, as the metal silicide film, molybdenum silicide (MoSi$_2$) film, tantalum silicide (TaSi$_2$) film or titanium silicide (TiSi$_2$) film may be used. As the insulating film cap and spacer, a silicon nitride film cap and spacer may be used. Further, the thickness of the second N$^-$-type polysilicon film etc. is not limited to the above-mentioned value.

Next, referring to FIGS. 4A to 6E as well as FIGS. 1 to 3C, a fabrication process of the semiconductor device in the first embodiment of the first form of the invention will be explained. FIGS. 4A to 4E are schematic cross sectional views showing the fabrication process corresponding to a part cut along the line IIIA–IIIA' in FIG. 2A, FIGS. 5A to 5E are schematic cross sectional views showing the fabrication process corresponding to a part cut along the line IIIB–IIIB' in FIG. 2B, and FIGS. 6A to 6E are schematic cross sectional views showing the fabrication process corresponding to a part cut along the line IIIC–IIIC' in FIG. 2B.

At first, the N-well 102 is formed in the cell array region 161a on the surface of the p-type silicon substrate 101, and the N-well 103 is formed around the cell array region 161a and in the P-channel MOS transistor region 161c on the p-type silicon substrate 101. Then, the P-well 106 is formed on the surface of the N-well 102 in the cell array region 161a of the p-type silicon substrate 101 and in the N-channel MOS transistor region 161b, resistance element region 161d and capacitance element region 161e etc. on the surface of the p-type silicon substrate 101. Then, the field insulating film 107 is formed in the device-separating region on the surface of the p-type silicon substrate 101. Then, the gate oxide film 108 of about 7 nm thick is formed, by thermal oxidation, on the surface of the p-well 106 to compose the cell array region 161a surrounded by the field insulating film 107, the surface of the p-well 106 to compose the N-channel MOS transistor region 161b surrounded by the field insulating film 107, the surface of the n-well 103 to compose the P-channel MOS transistor region 161c surrounded by the field insulating film 107, the device-forming region on the p-well 106 to compose the resistance element region 161d surrounded by the field insulating film 107, and the surface (not shown) of the p-well 106 to compose the capacitance element region 161e surrounded by the field insulating film 107.

Then, after forming the direct contact hole 109 through the gate oxide film 108 in the resistance element region 161d, on the entire surface, the first N$^-$-type polysilicon film of about 100 nm thick (not clearly shown), first tungsten silicide film of about 100 nm thick (not clearly shown) and first silicon dioxide film of about 100 nm thick (not clearly shown) are formed in this order. Here, the first N$^+$-type polysilicon film is formed by, e.g., low-pressure CVD (LPCVD). N-type impurity included in the first N$^-$-type polysilicon film is phosphorus (P). The first tungsten silicide film is formed by, e.g., sputtering, and the first silicon dioxide film is formed by, e.g., atmospheric-pressure CVD (APCVD). Then, by using a photoresist film pattern (not shown) as a mask, the first silicon dioxide film, first tungsten silicide film and first N$^+$-type polysilicon film are anisotropic-etched. Thereby, the silicon dioxide film caps 118a, 118b, 118c, 118d etc., word line 117a, gate electrodes 117b, 117c etc. and dummy gate electrode 117d are formed. The word line 117a is formed laminating the tungsten silicide film pattern 116a on the N$^-$-type polysilicon film pattern 111a. The gate electrode 117b is formed laminating the tungsten silicide film pattern 116b on the N$^+$-type polysilicon film pattern 111b. The gate electrode 117c is formed laminating the tungsten silicide film pattern 116c on the N+-type polysilicon film pattern 111c. The dummy gate electrode 117d is formed laminating the tungsten silicide film pattern 116d on the N+-type polysilicon film pattern 111d. Then, by using a photoresist film pattern 173 covering the P-channel MOS transistor region 161c as a mask, the ion implantation of phosphorus is conducted. Thereby, the N⁻-type diffusion layers 119aa, 119ab are formed self-alignedly to the word line 117a on the surface of the P-well 106 composing the cell array region 161a. Also, the N⁻-type diffusion layer 119b is formed self-alignedly to the gate electrode 117b on the surface of the P-well 106 composing the N-channel MOS transistor region 116b. Also, the N+-type diffusion layer 119da is formed self-alignedly to the dummy gate electrode 117d in the device-forming region of the resistance element region 161d [FIGS. 4A, 5A, 6A with FIGS. 1 to 3C].

Then, after removing the photoresist film pattern 173, the second silicon dioxide film of about 60 nm thick is formed on the entire surface. The silicon dioxide film 121 is preferably HTO film by high-temperature CVD. Then, a photoresist film pattern 174 is formed to cover the N-channel MOS transistor region 161b, P-channel MOS transistor region 161c, capacitance element region 161e and the device-forming region in the resistance element region 161d, and to have apertures at the resistance element region 161d except the device-forming region and the cell array region 161a. Then, anisotropic-etching is conducted by using the photoresist film pattern 174. Thereby, the silicon dioxide film 121 is etched back, forming the silicon dioxide film spacer 121a on the side of the word line 117a and the silicon dioxide film spacer 121d on the side of the gate electrode 117b except the part to be connected to the device-forming region of the resistance element region 161d. In the device-forming region of the resistance element region 161d, the silicon dioxide film 121 is left covering one end of the gate electrode 117d [FIGS. 4B, 5B and 6B with FIGS. 1 to 3C].

Then, after removing the photoresist film pattern 174, the second N+-type polysilicon film (not clearly shown) of about 150 nm thick at its flat part is formed on the entire surface. N-type impurity included in the second N+-type polysilicon film is also phosphorus. The second N+-type polysilicon film is preferably to the N+-type in the film-forming stage (in-situ) because it needs to have an uneven-covering characteristic and to function as a diffusion source. Therefore, the second N+-type polysilicon film is preferably formed by low-pressure CVD (LPCVD). Alternatively, amorphous silicon film including high-concentration phosphorus in-situ may be formed by LPCVD. Then, by anisotropic-etching using the photoresist film pattern 176 as a mask, the second N+-type polysilicon film is patterned. Thereby, the extraction pads 122aa, 122ab and the resistance element 122d are formed [FIGS. 4C, 5C and 6C with FIGS. 1 to 3C].

After removing the photoresist film pattern 176, a rapid thermal processing is conducted. By this thermal processing, the N+-type diffusion layers 123aa, 123ab are formed just under the extraction pads 122aa, 122ab (forming the N-type source/drain regions 124aa, 124ab of N-channel MOS transistor to compose the memory cell), and the N+-type diffusion layer 123da is formed in the device-forming region (of the p-well 106 to compose the resistance element region 161d) connected directly to the gate electrode 117d. Subsequently, a photoresist film pattern 177 is formed covering the cell array region 161a, P-channel MOS transistor region 161c and resistance element 161d. By anisotropic-etching using the photoresist film pattern 177 as a mask, the silicon dioxide film 121 is etched back, thereby the silicon dioxide film spacer 121b is formed. Further, by ion-implanting arsenic using the photoresist film pattern 177 as a mask, the N+-type diffusion layer 123b is formed. Thereby, the N-type source/drain region 124b of the N-channel MOS transistor in the N-channel MOS transistor region 161b is formed, thus the formation of the N-channel MOS transistor itself is completed [FIGS. 4D, 5D and 6D with FIGS. 1 to 3C].

Then, after removing the photoresist film pattern 177, a photoresist film pattern 178 with an aperture only at the P-channel MOS transistor region 161c is formed. By anisotropic-etching using the photoresist film pattern 178 as a mask, the silicon dioxide film 121 is etched back, thereby the silicon dioxide film spacer 121c is formed. Further, by ion-implanting boron difluoride ($BF_2$) using the photoresist film pattern 178 as a mask, the P-type source/drain region 125 of P+-type diffusion layer is formed. Thereby, the formation of the P-channel MOS transistor in the P-channel MOS transistor region is completed [FIGS. 4E, 5E and 6E with FIGS. 1 to 3C].

Then, the photoresist film pattern 178 is removed. Thereafter, the first interlayer insulating film 131 is formed on the entire surface. Then, the bit contact hole 132 and the bit line 134 are formed. Further, the second interlayer insulating film 141 is formed on the entire surface. Then, the node contact hole 142 and the contact plug 143 are formed. Further, the storage node electrode 144, the capacitive insulating film 145, the cell plate electrode 146 and the third interlayer insulating film 151 are formed. Thereby, the semiconductor device in the first embodiment of the first form of the invention is obtained [FIGS. 1 to 3C].

Meanwhile, means for fixing the potential of the dummy gate electrode 117d provide in the resistance element region 161d is not limited to that described in the first embodiment of the first form.

Figure 7A:
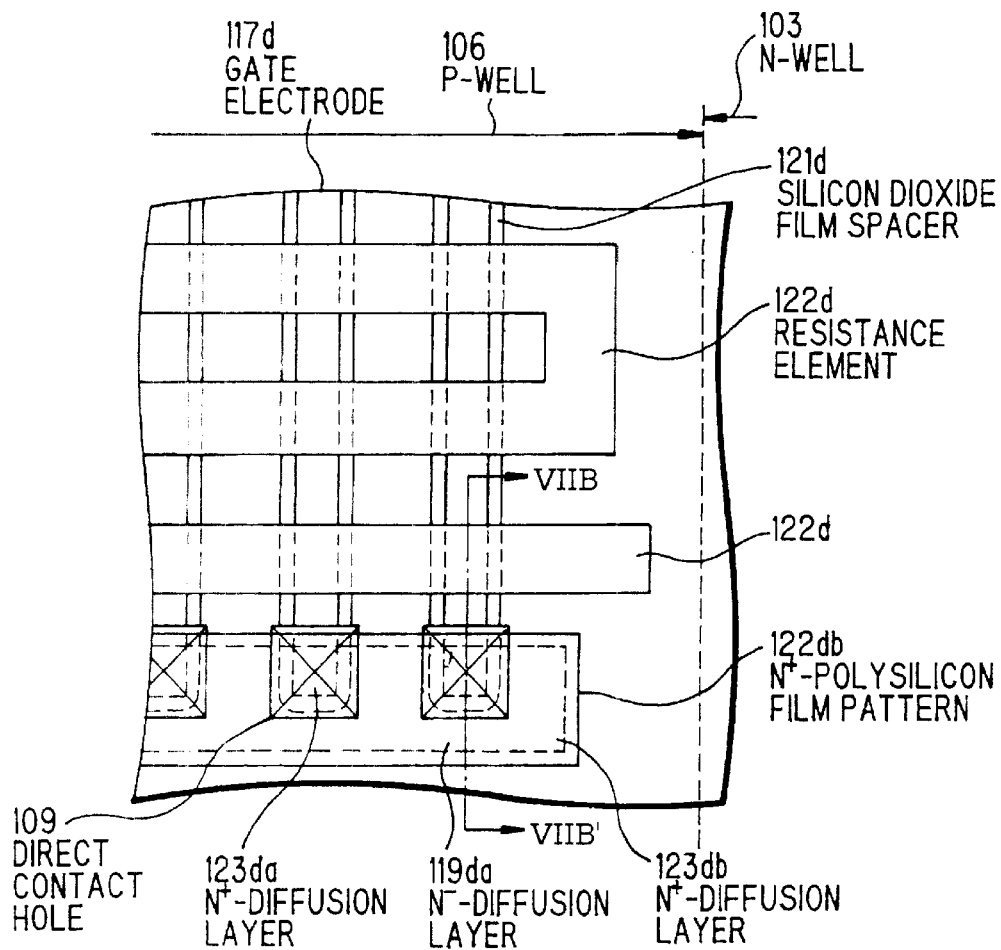
FIG. 7A is a partial plan view showing a semiconductor device in a second preferred embodiment of the first preferred form of the invention.
Figure 7B:
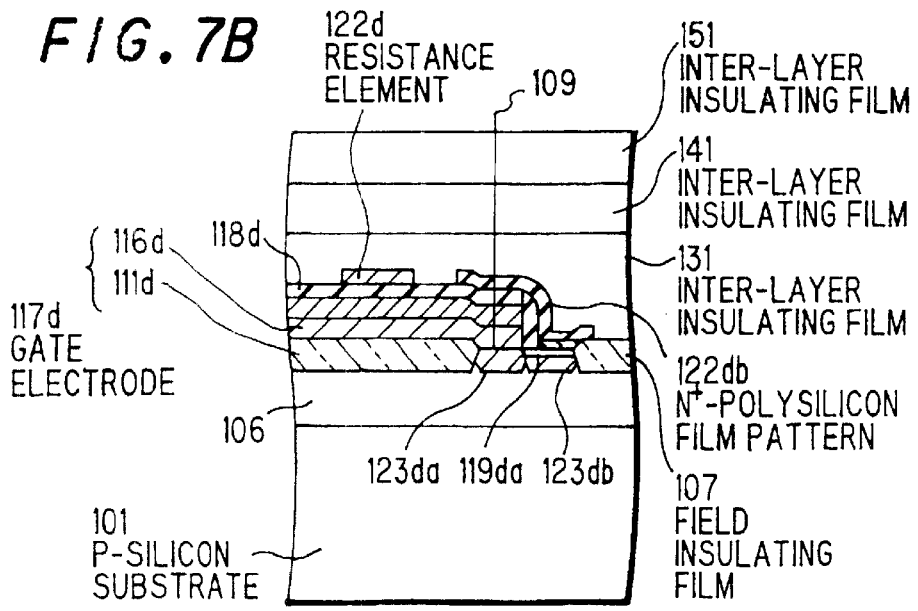
FIG. 7B is a cross sectional view cut along the line VIIB–VIIB' in FIG. 7A.

Next, referring to FIGS. 7A and 7B, a semiconductor device in the second preferred embodiment of the first form of the invention will be explained below. FIG. 7A is a partial plan view showing the semiconductor device in the second preferred embodiment of the first form of the invention, and FIG. 7B is a schematic cross sectional view cut along the line VIIB–VIIB' in FIG. 7A. In the second embodiment of the first form, the means for fixing the potential of the dummy gate electrode 117d formed on the surface of the P-well 106 to composed the resistance element region 161d is different from that in the first embodiment of the first form.

The composition of the dummy gate electrode 117d in the second embodiment of the first form will be explained below.

On the surface of the P-well 106 to compose the resistance element region 161d, the several dummy gate electrodes 117d comprising the N+-type diffusion layer 111d and the tungsten silicide film pattern 116d to be laminated thereon are provided through the field insulating film 107. The top surface of the gate electrode 117d is directly covered with the silicon dioxide film cap 118d, and the side of the gate electrode 117d (and silicon dioxide film cap 118d) is directly covered with the silicon dioxide film spacer 121d.

On one end of the resistance element region 161d, there is provided a device-forming region surrounded by the field insulating film 107. The direct contact hole 109 is formed through the gate oxide film 108 (which is removed by etching when forming the silicon dioxide film spacer 121d) formed on the surface of the device-forming region. The surface of the device-forming region including the gate electrode 117d around the direct contact hole 109 is covered with a N$^+$-type polysilicon film pattern 122db of the second N$^+$-type polysilicon film which is the same layer as the resistance element 122d. The gate electrode 117d is directly connected through the direct contact hole 109 to the surface of the P-well 106. On the surface of the P-well 106 composing the device-forming region, there are provided the N$^+$-type diffusion layer 123da just under the gate electrode 117d and the N$^+$-type diffusion layer 119da self-alignedly to the gate electrode 117d. Further, just under the N$^+$-type polysilicon film patter 122db in the device-forming region, there is provided a N$^+$-type diffusion layer 123db with a junction depth of about 0.15 μm self-alignedly to the silicon dioxide film spacer 121d. The N$^+$-type diffusion layer 119da and the N$^+$-type diffusion layer 123da are directly connected with each other, and the N$^+$-type diffusion layer 123db is connected to a fixed potential at a certain part (not shown).

The semiconductor device in the second embodiment of the first form has the same effect as that in the first embodiment of the first form.

Figure 8A:
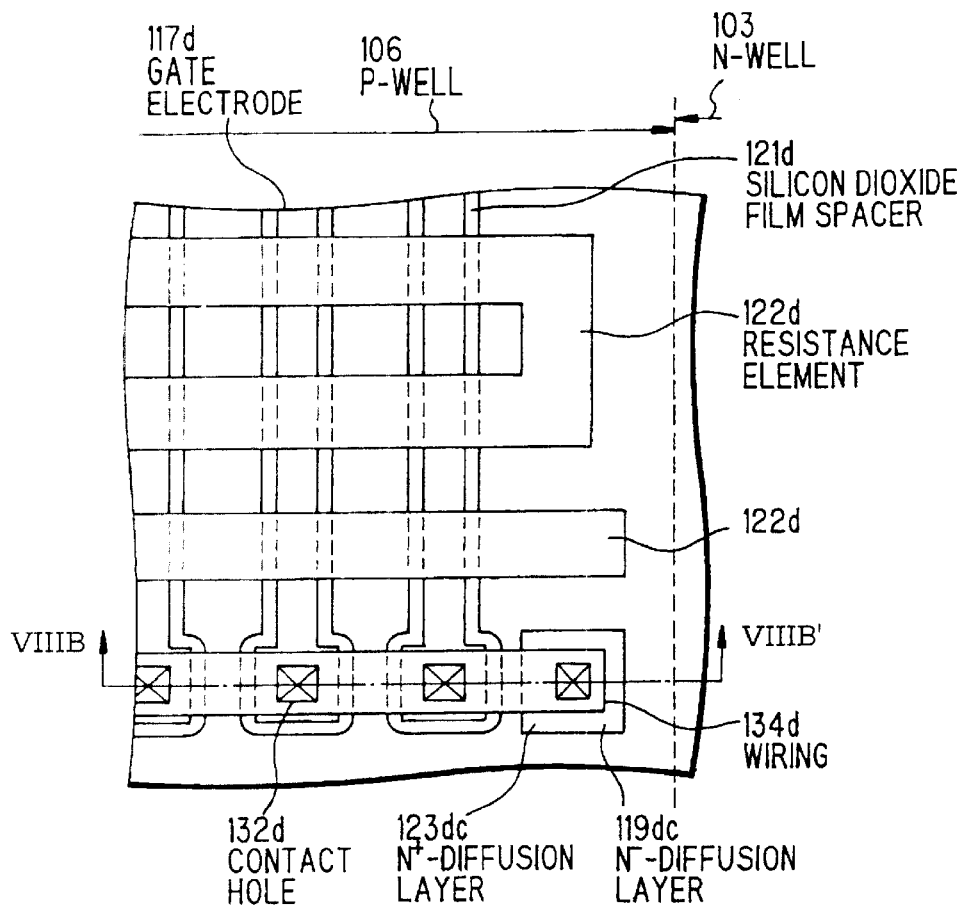
FIG. 8A is a partial plan view showing a semiconductor device in a third preferred embodiment of the first preferred form of the invention.
Figure 8B:
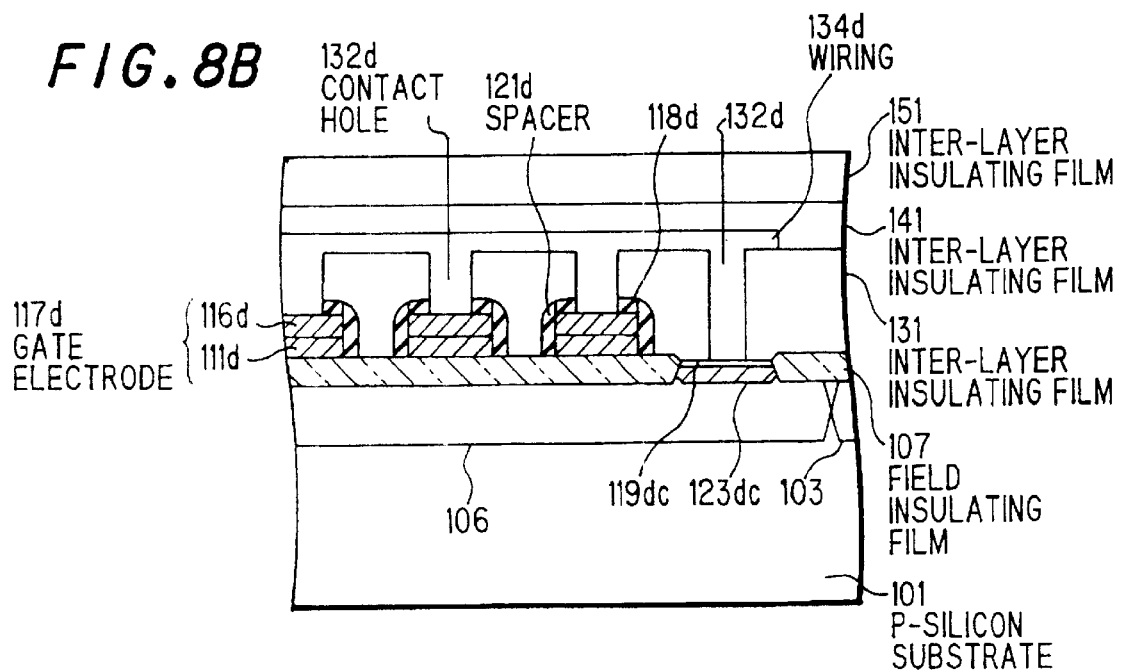
FIG. 8B is a cross sectional view cut along the line VIIIB–VIIIB' in FIG. 8A.
Figure 11A:
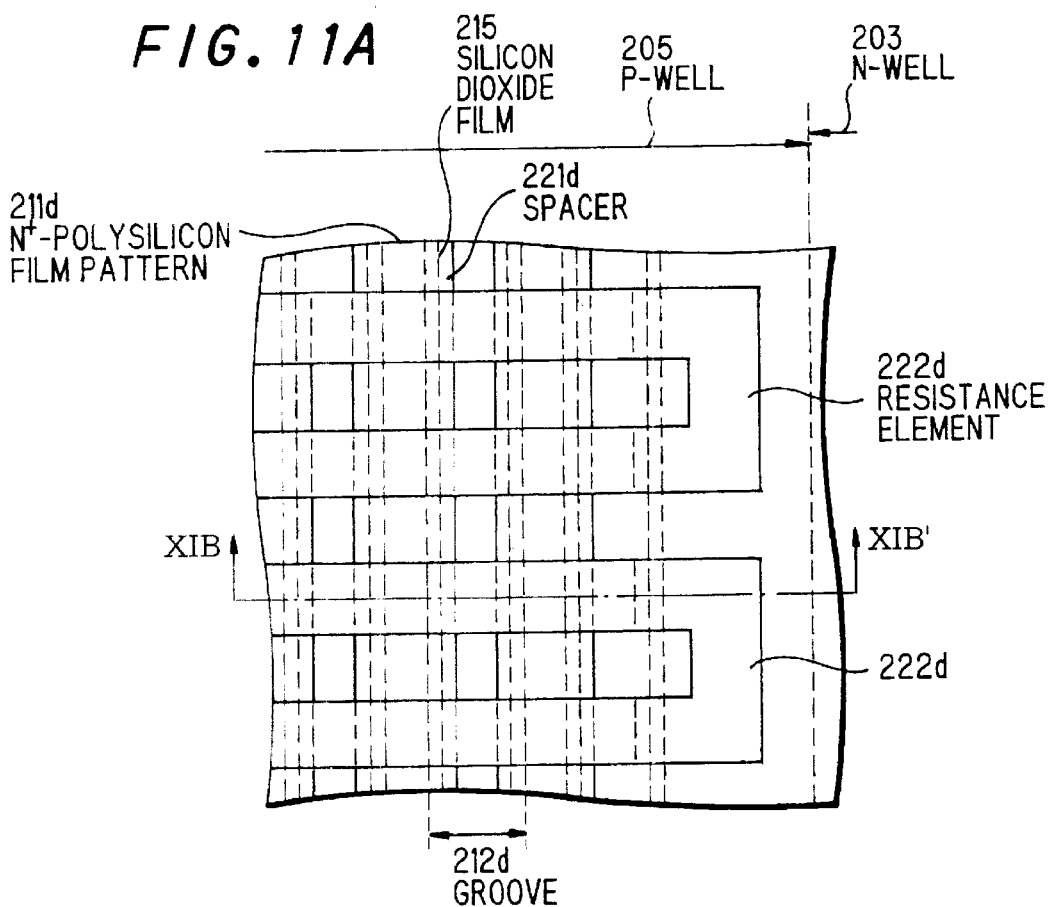
FIG. 11A is an enlarged plan view showing region B in FIG. 9.
Figure 11B:
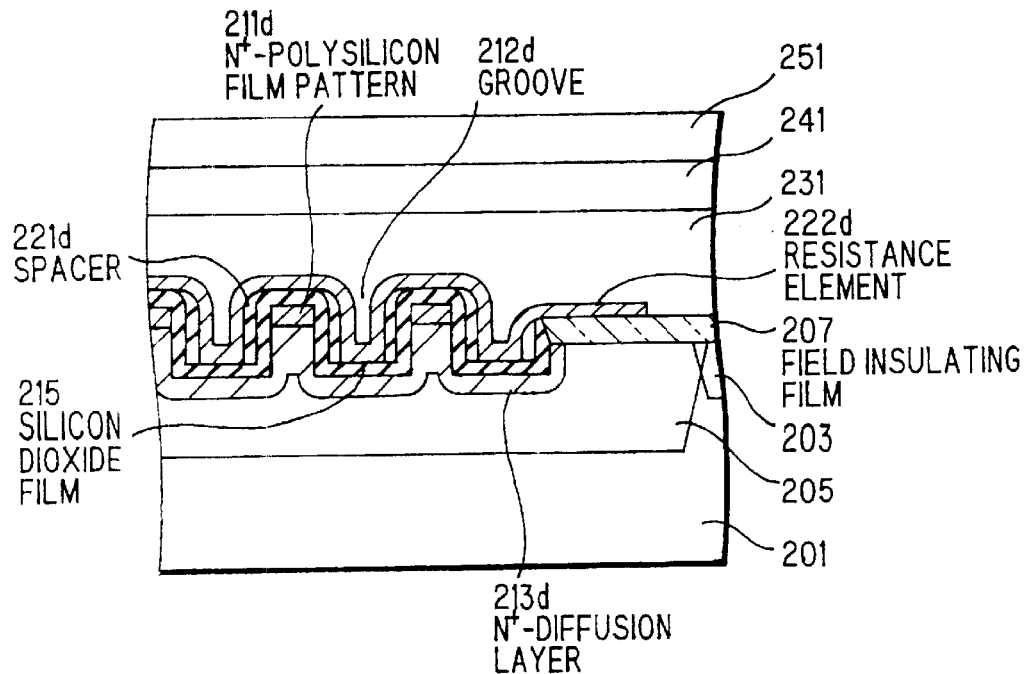
FIG. 11B is a cross sectional view cut along the line XIB–XIB' in FIG. 11A.

Next, referring to FIGS. 8A and 8B, a semiconductor device in the third preferred embodiment of the first form of the invention will be explained below. FIG. 8A is a partial plan view showing the semiconductor device in the third preferred embodiment of the first form of the invention, and FIG. 8B is a schematic cross sectional view cut along the line VIIIB–VIIIB' in FIG. 8A. In the third embodiment of the first form, the means for fixing the potential of the dummy gate electrode 117d formed on the surface of the P-well 106 to compose the resistance element region 161d is different from those in the first and second embodiments of the first form.

The composition of the dummy gate electrode 117d in the third embodiment of the first form will be explained below.

On the surface of the P-well 106 to compose the resistance element region 161d, the several dummy gate electrodes 117d with a wiring pitch of about 0.7 μm which comprise the N$^+$-type diffusion layer 111d and the tungsten silicide film pattern 116d to be laminated thereon are provided through the field insulating film 107. The interval of the gate electrodes 117d is about 0.2 μm at their end parts and is about 0.5 μm at their parts except the end parts. The top surface of the gate electrode 117d is directly covered with the silicon dioxide film cap 118d, and the side of the gate electrode 117d (and silicon dioxide film cap 118d) is directly covered with the silicon dioxide film spacer 121d.

In part of the resistance element region 161d except just under the gate electrode 117d, there is provided a device-forming region surrounded by the field insulating film 107. On the surface of the device-forming region, a N$^-$-type diffusion layer 119dc with a junction depth of about 0.1 μm and a N$^+$-type diffusion layer 123dc with a junction depth of about 0.15 μm are formed. Also, contact holes 132d are formed through the first interlayer insulating film 131 to reach to the gate electrode 117d or the N$^+$-type diffusion layer 123dc. The gate electrodes 117d are electrically connected with each other through the contact holes 132d by wiring 134d (of the same second tungsten silicide film as the bit line) formed on the interlayer insulating film 131, and they are electrically connected to the N$^+$-type diffusion layer 123dc.

The semiconductor device in the third embodiment of the first form has also the same effect as that in the first embodiment of the first form.

Next, the second preferred form of the invention will be explained below. The main object of the invention can be also attained by the second form of the invention in addition to the first form of the invention.

The second form of the invention is also applied to a semiconductor device that includes a MOS transistor having a gate electrode composed of a metal polycide film including a first N$^-$-type polysilicon film, like the first form of the invention. The second form of the invention is characterized in that several N$^+$-type polysilicon film patterns of the first N$^+$-type polysilicon film are directly formed in parallel on the surface of a silicon substrate, grooves self-aligned to the N$^+$-type polysilicon film patterns are formed on the silicon substrate, and a resistance element with a large resistance value is thereby formed while having an uneven form. Thus, in the second form of the invention, the occupied area of the resistance element can be easily reduced. Furthermore, by using the idea of the second form of the invention, the occupied area of a capacitance element with a large capacitance value can be also reduced to attain the further object of the invention.

Figure 12A:
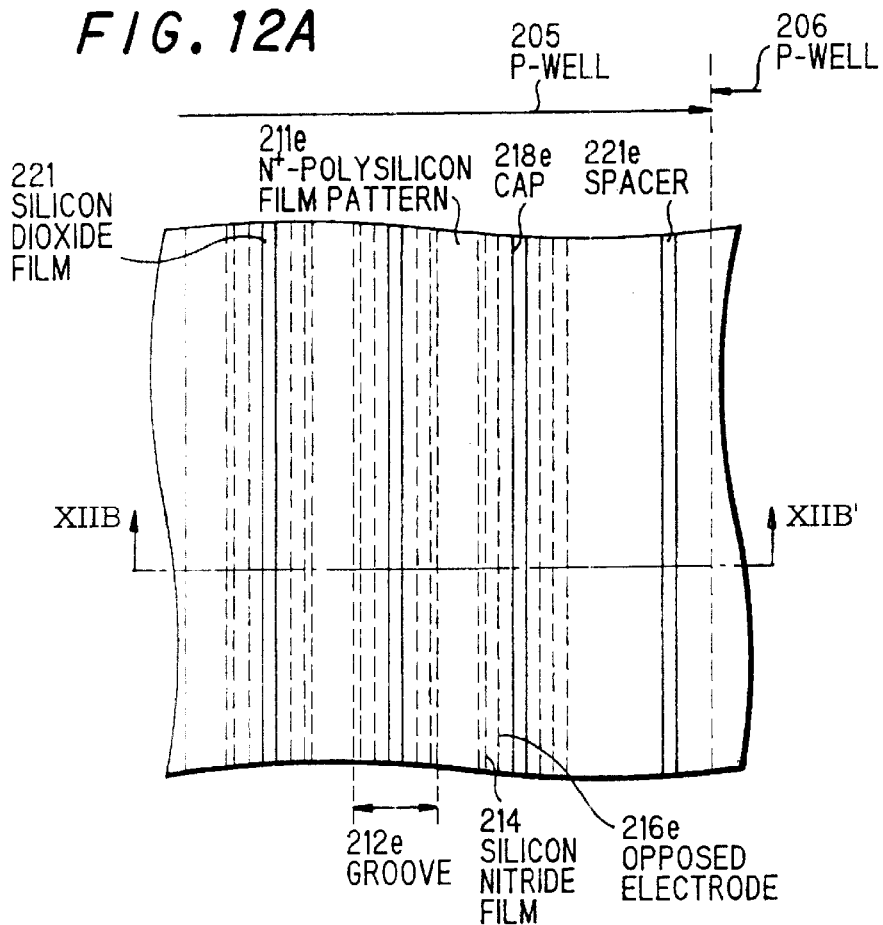
FIG. 12A is an enlarged plan view showing region C in FIG. 9.
Figure 12B:
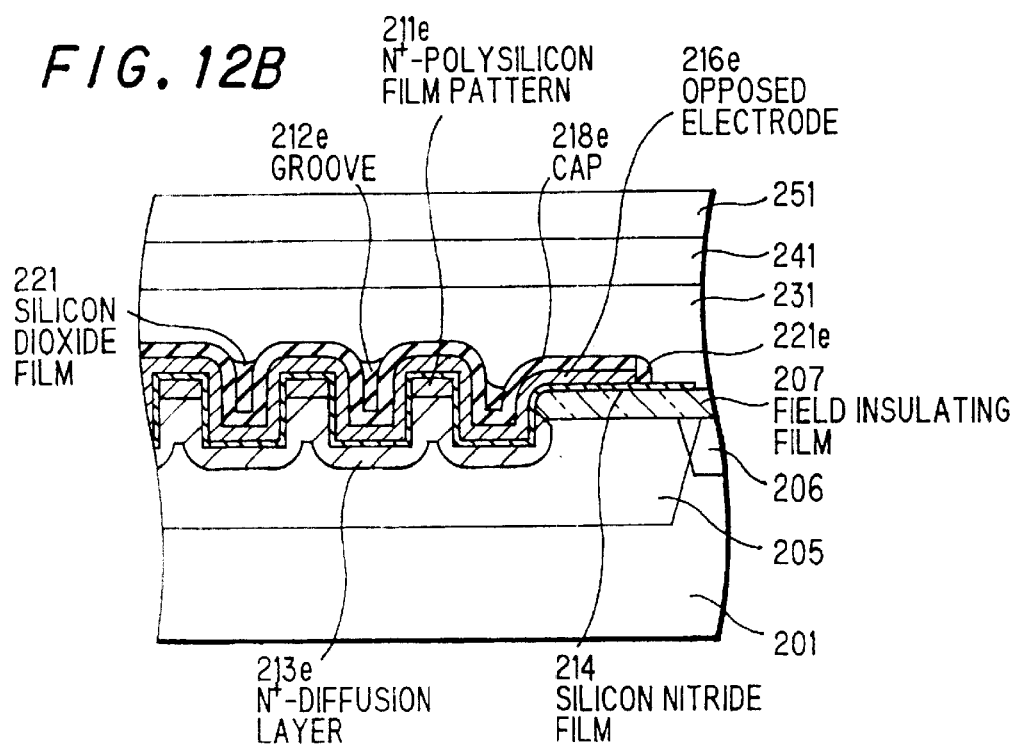
FIG. 12B is a cross sectional view cut along the line XIIB–XIIB' in FIG. 12A, FIGS. 13A to 13I are cross sectional views, illustrated along the line XB–XB' in FIG. 10A, showing a process of fabricating the semiconductor device in the first embodiment of the second form of the invention.
Figure 13A:
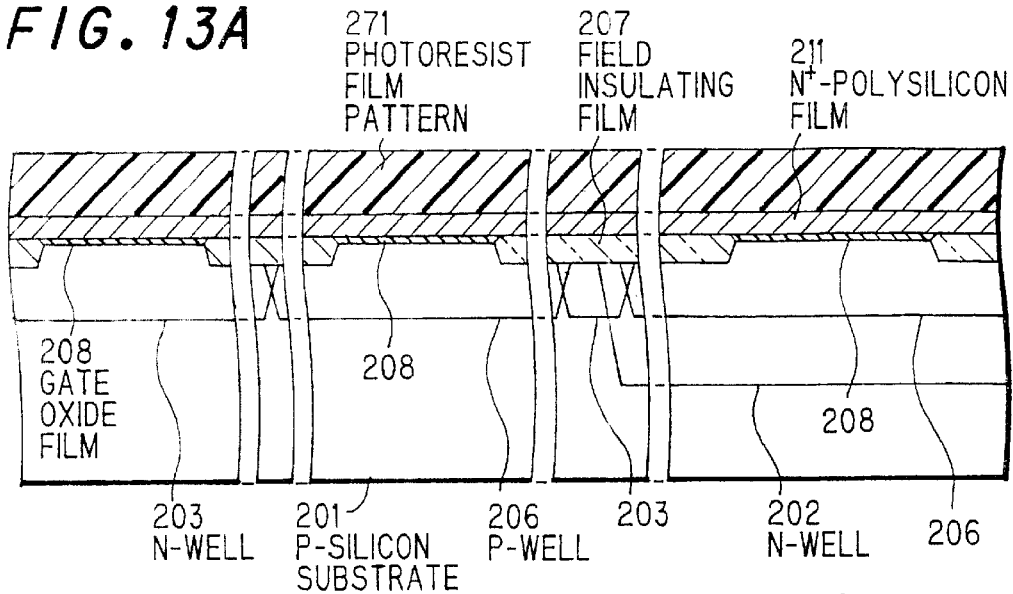
Figure 13B:
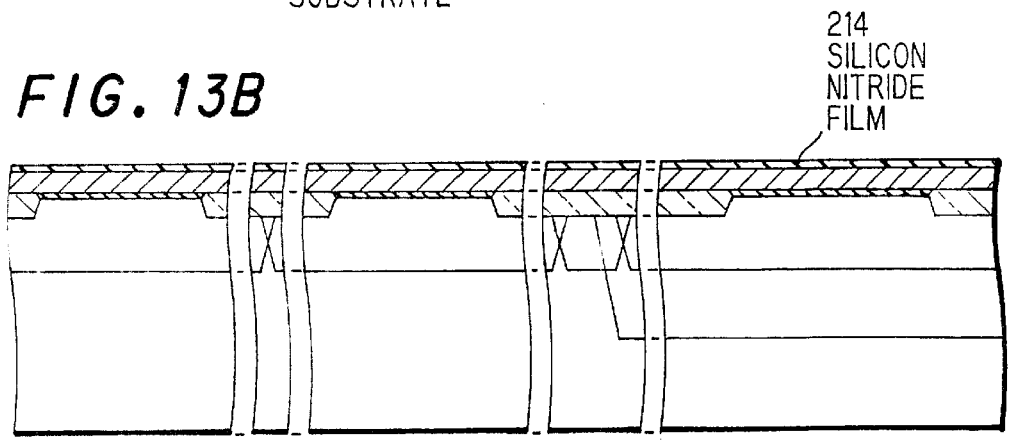
Figure 13C:
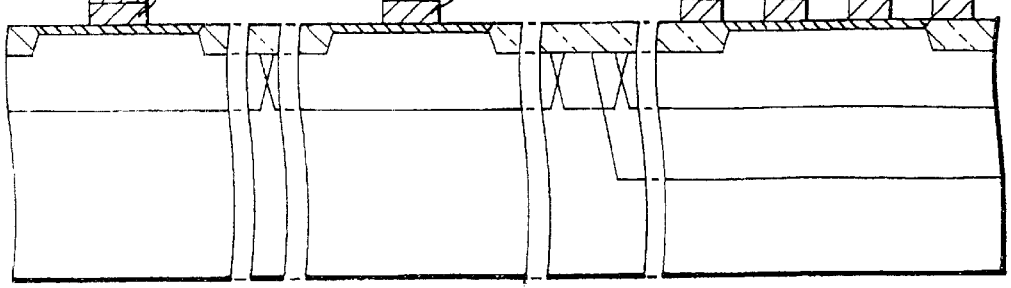
Figure 13G:
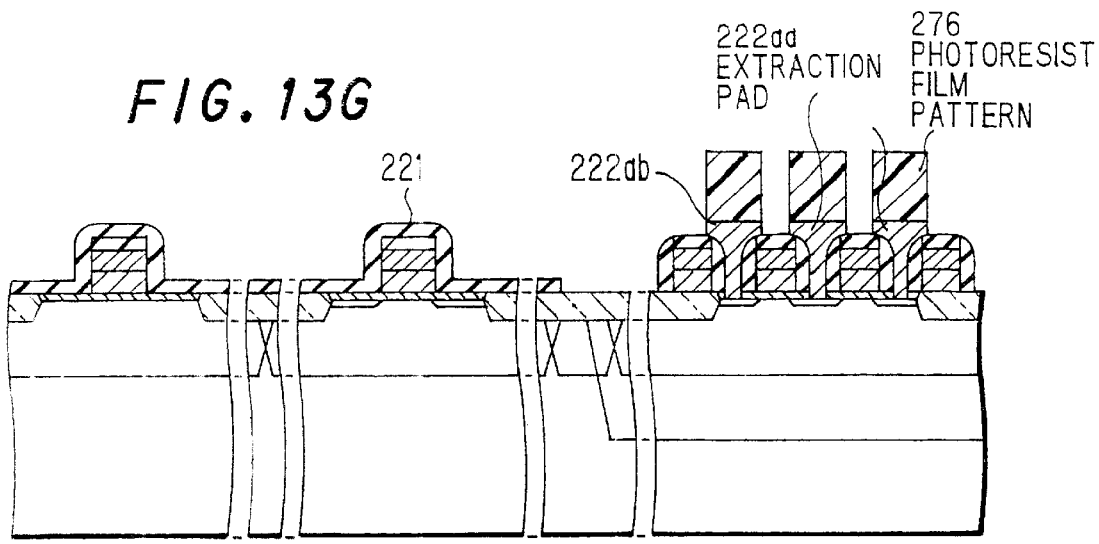
Figure 13H:
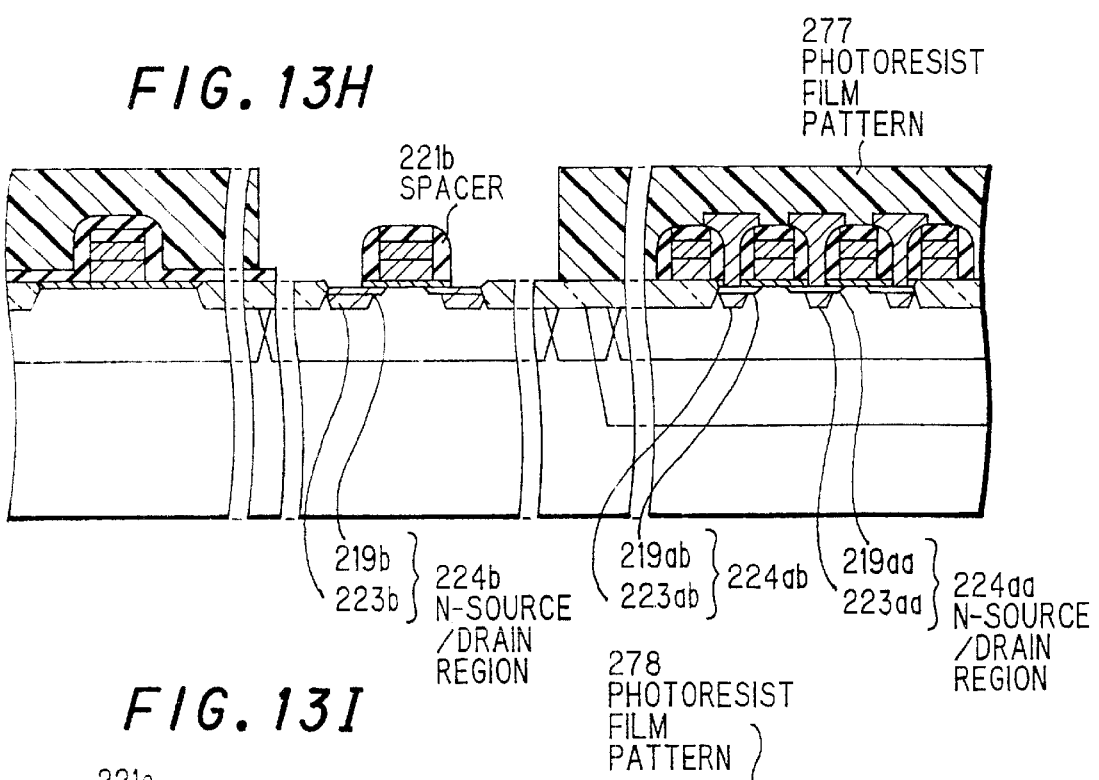
Figure 13I:
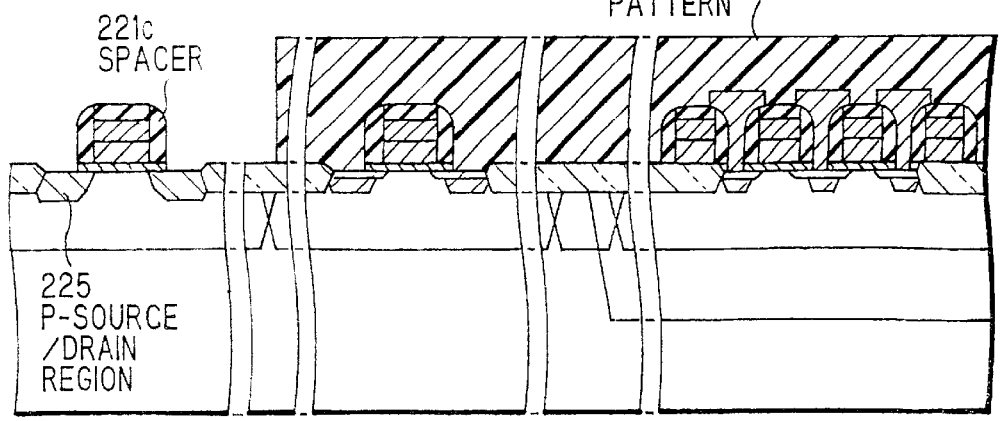
Figure 14A:
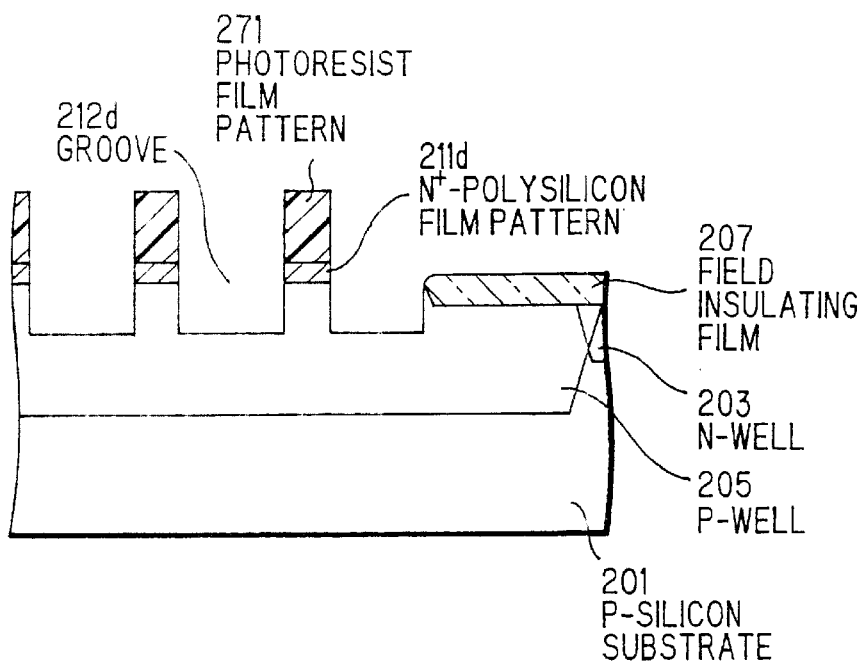
FIGS. 14A to 14I are cross sectional views, illustrated along the line XIB–XIB' in FIG. 11A, showing a process of fabricating the semiconductor device in the first embodiment of the second form of the invention.
Figure 14B:
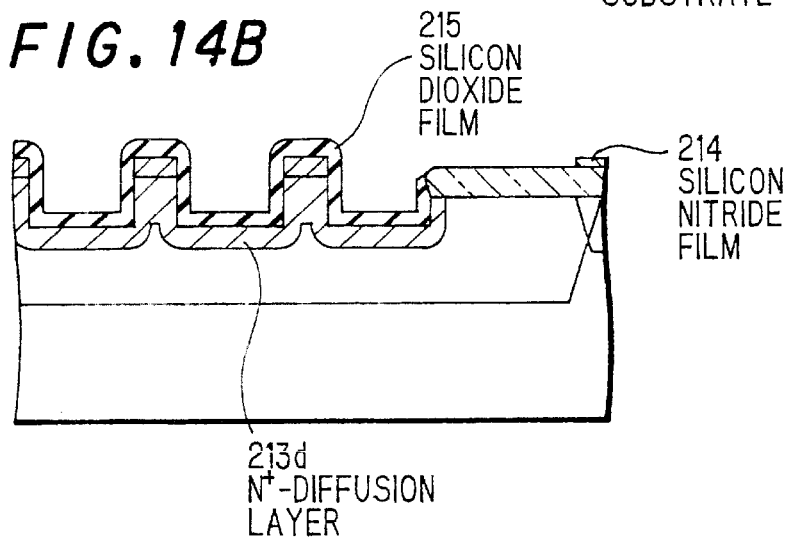
Figure 14C:
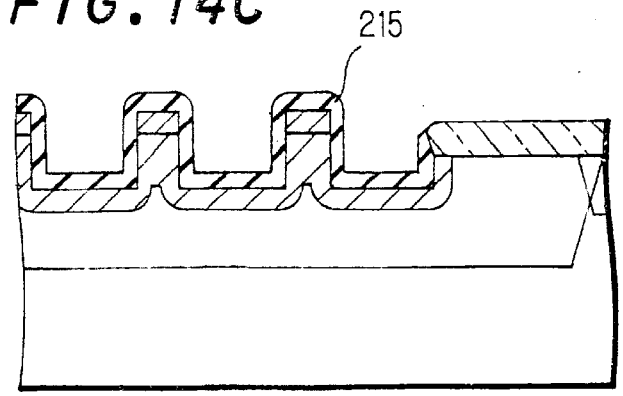
Figure 14D:
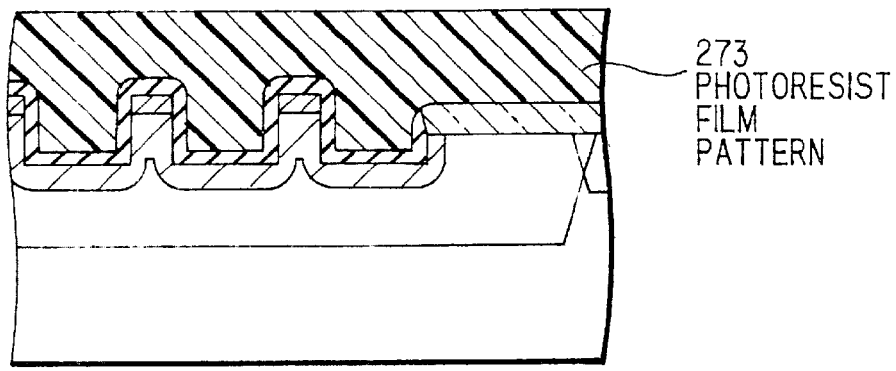
Figure 14E:
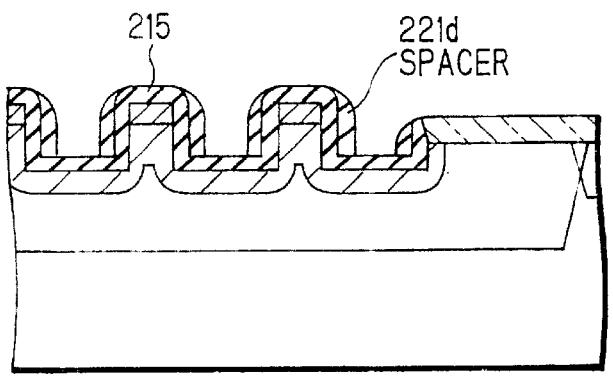
Figure 14F:
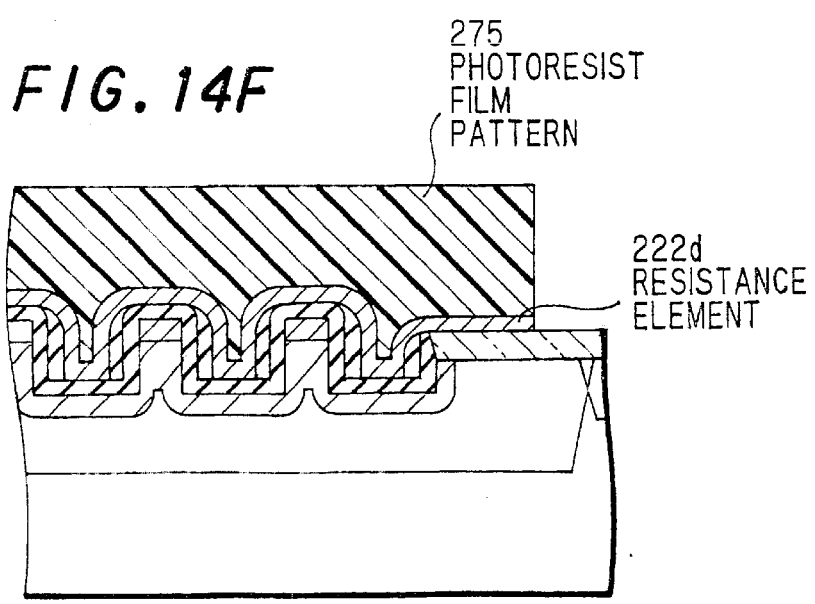
Figure 14G:
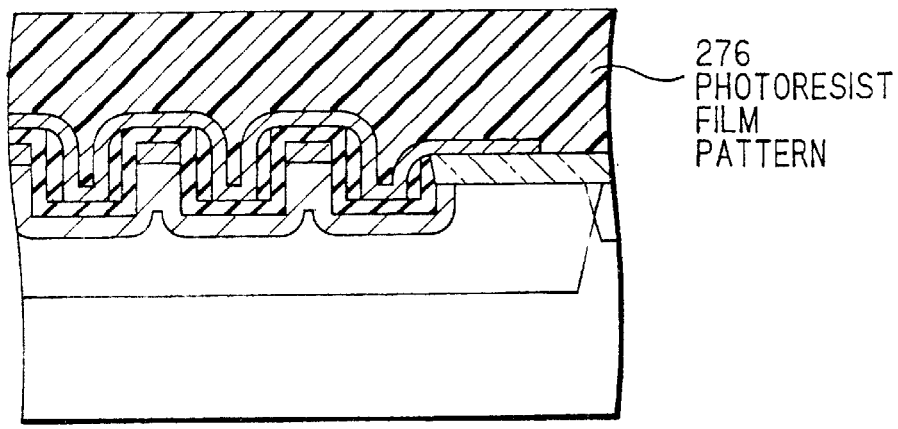
Figure 14H:
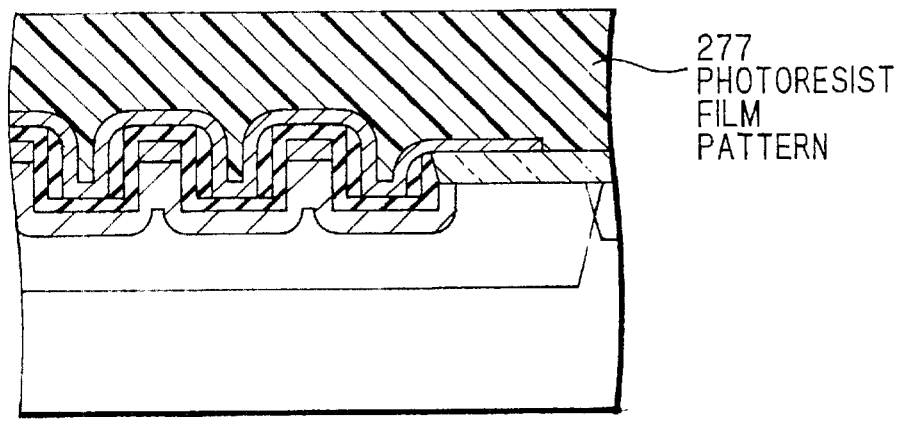
Figure 14I:
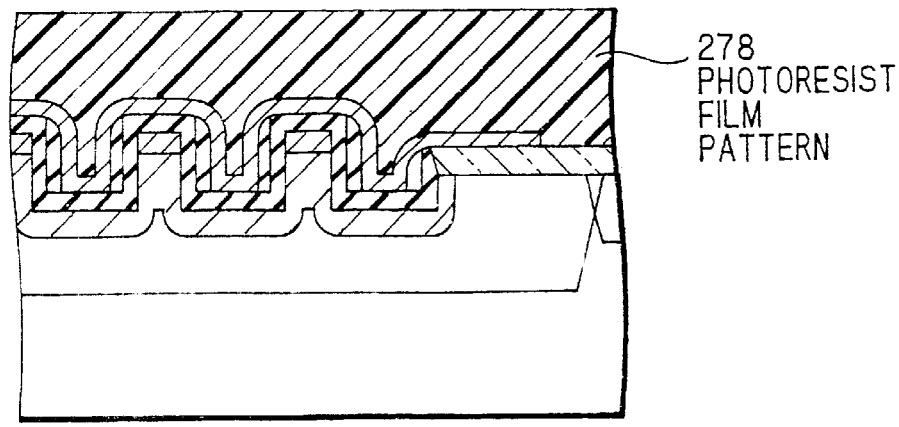
Figure 15D:
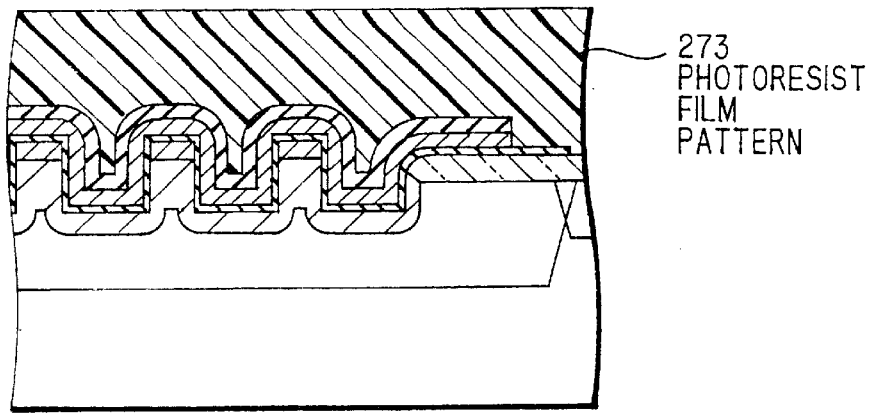
Figure 15E:
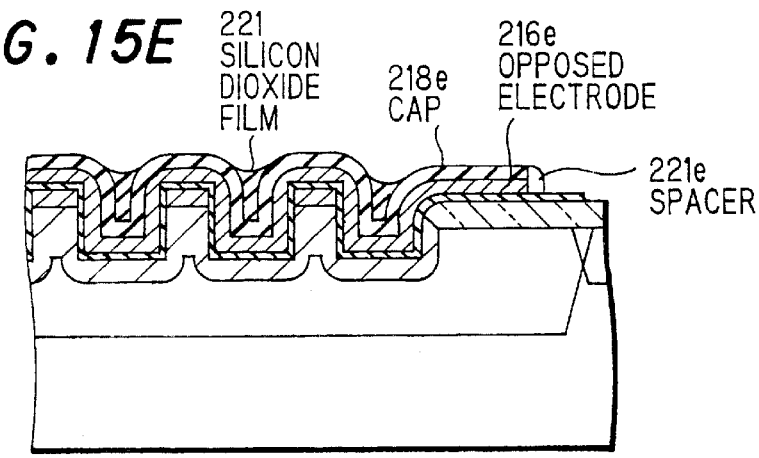
Figure 15F:
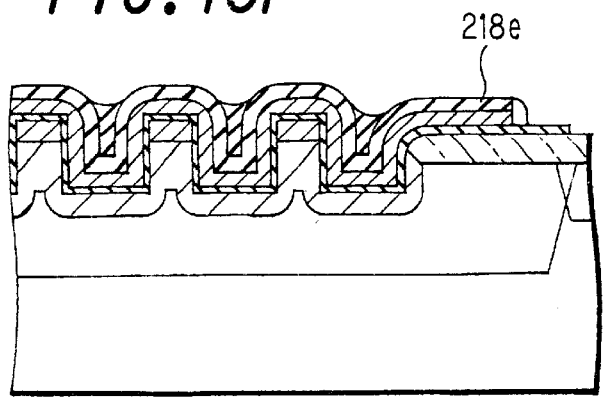
Figure 15G:
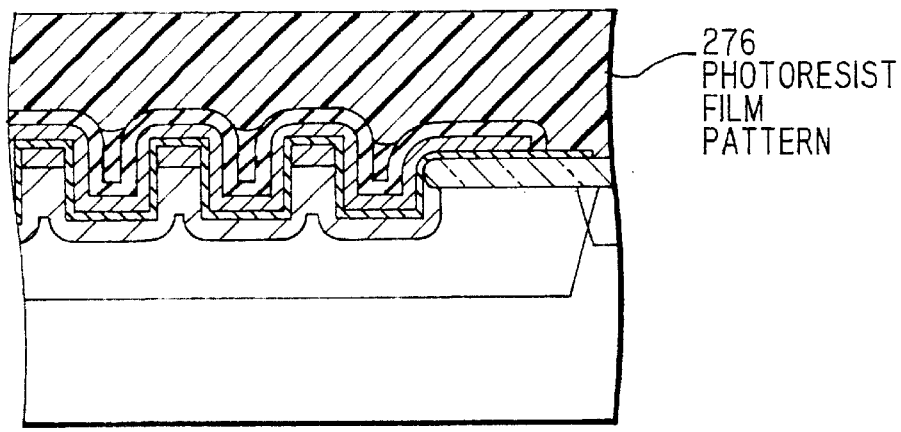
Figure 15H:
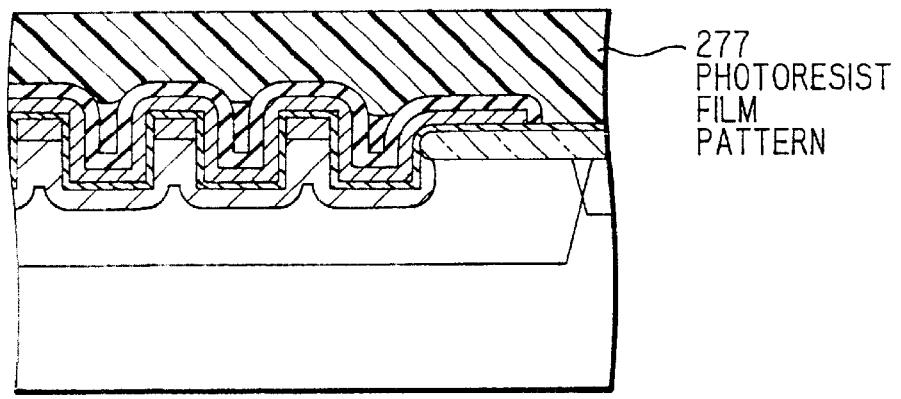
Figure 15I:
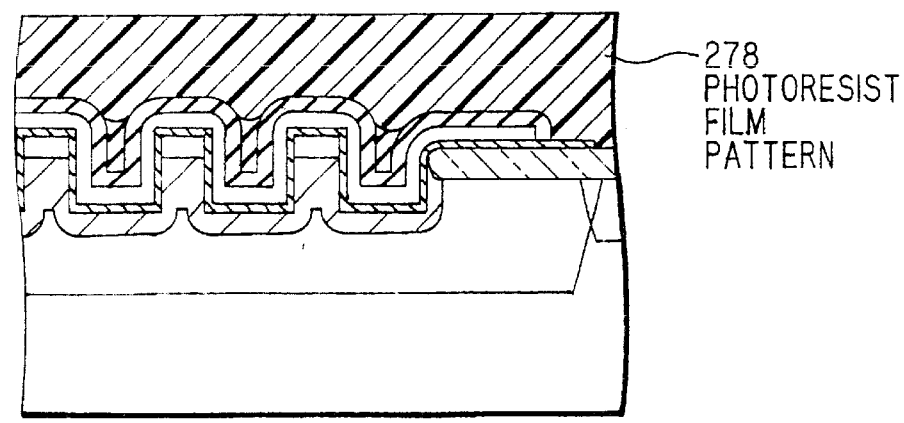

Referring to FIGS. 9 to 12B, a semiconductor device in the first referred embodiment of the second form of the invention will be explained below. FIG. 9 is a partial layout diagram showing the semiconductor device in the first preferred embodiment of the second form of the invention, FIG. 10A is an enlarged schematic plan view showing a region A in FIG. 9. FIG. 10B is a schematic cross sectional view cut along the line XB–XB' in FIG. 10A, FIG. 11A is an enlarged schematic plan view showing a region B in FIG. 9, FIG. 11B is a schematic cross sectional view cut along the line XIB–XIB' in FIG. 11A, FIG. 12A is an enlarged schematic plan view showing a region C in FIG. 9, and FIG. 12B is a schematic cross sectional view cut along the line XIIB–XIIB' in FIG. 12A. The first embodiment of the second form is also applied to a semiconductor device including DRAM with stacked type memory cells. For this semiconductor device, the 0.2 μm design rule is employed.

On the surface of a p-type silicon substrate 201, there are provided a cell array region 261a that DRAM with stacked type memory cells is formed, a N-channel MOS transistor region 261b that a N-channel MOS transistor is formed, a P-channel MOS transistor region 261c that a P-channel MOS transistor is formed, a resistance element region 261d that a resistance element with a large resistance value is formed, and a capacitance element region 261e that a capacitance element with a large capacitance value is formed. Further, on the surface of the p-type silicon substrate 201, there are provided a N-well 202 with a junction depth of about 7 μm, a N-well 203 with a junction depth of about 2 μm, a P-well 205 with a depth of about 3 μm, and a P-well 206 with a depth of about 2 μm. The cell array region 261a is formed on the surface of the P-well 206 formed on the surface of the N-well 202, and it (its P-well 206) is surrounded by the N-well 203 (being device-separated from the P-well 205 and other P-well 206). The N-channel MOS transistor region 261b and the P-channel MOS transistor region 261c are formed on the surface of the P-well 206 and N-well 203, respectively. The resistance element region 261d and the capacitance element region 261e are formed on the P-well 205. In a device separating region on the surface of the p-type silicon substrate 201 (including the N-well 202, N-well 202, N-well 203, P-well 205 and P-well 206), a field insulating film 207 of about 250 nm thick is formed [FIGS. 9 to 12B]. Meanwhile, in the first embodiment, the N-well 202 is formed so as to give a potential different from that of the p-type silicon substrate 201 to the P-well 206 of the cell array region 261a by forming the P-well 206 on the N-well 202. Thus, the N-well 202 is not necessarily needed.

On the surface of the P-well 206 composing the cell array region 261a, there is provided a word line 217a through a gate oxide film 208 (and field insulating film 207) of about 7 nm thick. The word line 217a is composed of a N$^+$-type polysilicon film pattern 211a of first N$^+$-type polysilicon film of about 100 nm thick and a tungsten silicide film pattern 216a of tungsten silicide (WSi$_2$) film (as a metal silicide film) of about 100 nm thick to be laminated thereon. The top surface of the word line 217a is directly covered with a silicon dioxide film cap 218a (or HTO film, not silicon dioxide film formed by APCVD) of about 100 nm thick, and the side of the word line 217a (and the silicon dioxide film cap 218a) is directly covered with a silicon dioxide film spacer 221a (of HTO film) of about 60 nm thick. The line width (gate length L), interval and wiring pitch of the word line 217a are about 0.25 μm, about 0.2 μm and about 0.45 μm, respectively. On the surface of the P-well 207 surrounded by the field insulating film 207 in the cell array region 261a, there are provided N$^-$-type diffusion layers 219aa, 219ab with a junction depth of about 0.1 μm self-alignedly to the word line 217a and N$^+$-type diffusion layers 223aa, 223ab with a junction depth of about 0.15 μm self-alignedly to the silicon dioxide film spacer 218a. The N-channel MOS transistor composing the memory cell comprises the gate oxide film 208, the word line 217a, a N-type source/drain region 224aa composed of the N$^-$-type diffusion layer 219aa and N$^+$-type diffusion layer 223aa, and a N-type source/drain region 224ab composed of the N$^-$-type diffusion layer 219ab and N$^+$-type diffusion layer 223ab. The line width (gate width W) and interval of the N-type source/drain regions 224aa, 224ab are about 0.2 μm and about 0.25 μm, respectively.

Extraction pads 222aa, 222ab of second N$^+$-type polysilicon film of about 150 nm thick at their flat parts are directly connected to the N-type source/drain regions 224aa and 224ab, respectively. The second N$^+$-type polysilicon film has a layer resistance of about 50 Ω/□. The extraction pads 222aa, 222ab are formed self-alignedly to the silicon dioxide film spacer 221a, and the minimum width and minimum interval of the extraction pads 222aa, 222ab are about 0.25 μm and about 0.2 μm, respectively. The N-channel MOS transistor composing the memory cell, the extraction pads 222aa, 222ab etc. are covered with (first) interlayer insulating film 231. A bit contact hole 232 reaching to the extraction pad 222aa is formed through the interlayer insulating film 231. The diameter of the bit contact hole is about 0.2 μm. A bit line 234 of (second) tungsten silicide film is provided on the surface of the interlayer insulating film 231. The bit line 234 is electrically connected to through the bit contact hole 232 to the extraction pad 222aa and N-type source/drain region 224aa.

The surface of the interlayer insulating film 231 is covered with (second) interlayer insulating film 241. A node contact hole 242 formed penetrating through the interlayer insulating films 241 and 231 are reaching to the extraction pad 222ab. The node contact hole 242 is filled with a contact plug 243 of conductive film, and the diameter of the node contact hole 242 is also about 0.2 μm. A storage node electrode 244 formed on the surface of the interlayer insulating film 241 is connected through the contact plug 243 filled in the node contact hole 242 to the extraction pad 222ab and N-type source/drain region 224ab. The width and interval of the storage node electrode 244 are about 0.25 μm and about 0.2 μm, respectively. The storage node electrode 244 is of a N$^+$-type polysilicon film pattern of about 0.9 μm thick, and the top surface and side of the storage node electrode 244 are directly covered with capacitive insulating film 245 of very thin silicon nitride film and tantalum oxide (Ta$_2$O$_5$) film. The capacitive insulating film 245 has a silicon-dioxide-film-converted thickness of about 3 nm. The storage node electrode 244 is covered through the capacitive insulating film 245 with a cell plate electrode 246. The cell plate electrode 246 is composed of titanium nitride (TiN) film of about 100 nm thick and tungsten silicide (WSi$_2$) film of about 100 nm thick to be laminated thereon. The surface of the cell plate electrode 246 is covered with (third) interlayer insulating film 251 [FIGS. 9, 10A and 10B].

On the P-well 206 and the N-well 203 composing the N-channel MOS transistor 261b and P-channel MOS transistor 261c, respectively, gate electrodes 217b and 217c are formed through the gate oxide film 208 etc. The gate electrodes 217b and 217c also comprise N$^+$-type polysilicon film patterns 211b, 211c of the first N$^+$-type polysilicon film of about 100 nm thick and tungsten silicide film patterns 216b, 216c of tungsten silicide (WSi$_2$) film (as a metal silicide film) of about 100 nm thick to be laminated thereon. The top surface of the gate electrodes 217b, 217c are directly covered with silicon dioxide film cap 218b, 218c of about 100 nm thick. Also, the sides of the gate electrodes 217b (and silicon dioxide film cap 218b) and the gate electrode 217c (and silicon dioxide film cap 218c) are directly covered with silicon dioxide film spacers 221b, 221c, respectively of about 60 nm thick. The gate length L of the gate electrode 217b is about 0.3 μm, and the gate length L of the gate electrode 217c is about 0.35 μm.

On the surface of the P-well 206 surrounded by the field insulating film 207 in the N-channel MOS transistor region 261b, a N$^-$-type diffusion layer 219b with a junction depth of about 0.1 μm is formed self-alignedly to the gate electrode 217b and a N$^+$-type diffusion layer 223b with a junction depth of about 0.2 μm is formed self-alignedly to the silicon dioxide film spacer 221b. The N-channel MOS transistor formed in the N-channel MOS transistor region 261b comprises the gate oxide film 208, the gate electrode 217b, and a N-type source/drain region 224b composed of the N$^-$-type diffusion layer 219b and the N$^+$-type diffusion layer 223b. Also, on the surface of the N-well 203 surrounded by the field insulating film 207 in the P-channel MOS transistor region 261c, a P-type source/drain region 225 of P$^+$-type diffusion layer with a junction depth of about 0.2 μm is formed self-alignedly to the silicon dioxide film spacer 221c. The P-channel MOS transistor formed in the P-channel MOS transistor region 261c comprises the gate oxide film 208, the gate electrode 217c, and the P-type source/drain region 225 of P$^+$-type diffusion layer. The surface of the N-channel MOS transistor region 261b and P-channel MOS transistor region 261c including the N-channel MOS transistor and P-channel MOS transistor is covered with the interlayer insulating film 231. Also, in these regions, the surface of the interlayer insulating film 231 is covered with the interlayer insulating film 241, and further the surface of the interlayer insulating film 241 is covered with the interlayer insulating film 251 [FIGS. 9, 10A and 10B].

Next, several first N$^+$-type polysilicon film patterns 211d of the first N$^+$-type polysilicon film of about 100 nm with a line width of about 0.2 μm are formed directly connecting onto the surface of the P-well 205 composing the resistance element region 261d. Both ends of the N$^+$-type polysilicon film patterns 211d are preferably extending on the field insulating film 207. The N$^+$-type polysilicon film pattern 211d are formed in parallel at intervals of, e.g., 0.7 μm, (as first required intervals). The wiring pitch of the first N$^+$-type polysilicon film patterns 211d is about 0.9 μm. Further, on the surface of the P-well 205 composing the resistance element region 261d, first grooves 212d of about 0.7 µm deep are formed self-alignedly to the N⁻-type polysilicon film patterns 211d. A N⁺-type diffusion layer 213d with a junction depth of abut 0.3 µm is formed on the P-well 205 at part to be directly connected to the N⁺-type polysilicon film pattern 211d and part to form the exposed surface of the groove 212d. The exposed surface of the groove 212d and the side and top surface of the N⁺-type polysilicon film pattern 211d are directly covered with silicon dioxide film 215 of about 100 nm thick to be formed by thermal oxidation. Further, the sides of the N⁺-type polysilicon film pattern 211d and groove 212d are covered through the silicon dioxide film 215 with a silicon dioxide film spacer 221d.

On the surface of the capacitance element region 261e, the resistance element 222d of a N⁺-type diffusion layer pattern, which is the same layer as the second N⁺-type polysilicon film of about 150 nm thick to compose the extraction pad 222aa etc., is formed through the silicon dioxide film 215 (and the silicon dioxide film spacer 221d) on the N⁺-type polysilicon film pattern 211d and the groove 212d, while reciprocative-crossing several times in the orthogonal direction of the N⁺-type polysilicon film pattern 211d. The line width and interval of the resistance element 222d are about 0.8 µm and about 0.8 mµm, respectively. The surface of the resistance element region 261d including the resistance element 222d is also covered with the interlayer insulating film 231. Further, the surface of the interlayer insulating film 231 is covered with the interlayer insulating film 241, and further the surface of the interlayer insulating film 241 is covered with the interlayer insulating film 251 [FIGS. 9, 11A and 11B].

Also, several second N⁺-type polysilicon film patterns 211e of the first N⁺-type polysilicon film of about 100 nm with a line width of about 0.2 µm are formed directly connecting onto the surface of the P-well 205 composing the capacitance element region 261e. Both ends of the N⁺-type polysilicon film patterns 211e are also preferably extending on the field insulating film 207. The N⁺-type polysilicon film patterns 211e are formed in parallel at intervals of, e.g., 0.6 µm, (as second required intervals). The wiring pitch of the second N⁺-type polysilicon film patterns 211e is about 0.8 µm. Further, on the surface of the P-well 205 composing the capacitance element region 261e, second grooves 212e of about 0.7 µm deep are formed self-alignedly to the N⁺-type polysilicon film patterns 211e. A N⁺-type diffusion layer 213e with a junction depth of about 0.3 µm is formed on the P-well 205 at part to be directly connected to the N⁺-type polysilicon film pattern 211e and part to form the exposed surface of the groove 212e. The exposed surface of the groove 212e and the side and top surface of the N⁺-type polysilicon film pattern 211e are directly covered with silicon nitride film 214 as (first) capacitive insulating film of about 20 nm thick.

The surface of the silicon nitride film 214 is covered with opposed electrode 216e of first tungsten silicide film of about 100 nm thick, which is the same layer as the first tungsten silicide film to compose the word line 217a etc. The top surface of the opposed electrode 216e is covered with a silicon dioxide film cap 218e, and the side of the opposed electrode 216e (and the silicon dioxide film cap 218e) is covered with silicon dioxide film spacer 221e of about 60 nm thick. On the surface of the silicon dioxide film cap 218e (at part over the groove 212e), silicon dioxide film 221, which is the same layer as the silicon dioxide film spacer 221e, may be left. The capacitance element comprises the N⁺-type diffusion layer 213e, the silicon nitride film 214 and the opposed electrode 216e. The surface of the capacitance element region 261e including the capacitance element 222e is also covered with the interlayer insulating film 231. Further, the surface of the interlayer insulating film 231 is covered with the interlayer insulating film 241, and further the surface of the interlayer insulating film 241 is covered with the interlayer insulating film 251 [FIGS. 9, 12A and 12B].

The effects of the semiconductor device in the first embodiment of the second form of the invention will be explained below.

First, the effect as to the reduction in occupied area of the resistance element as the main object of the invention is as follows:

In the first embodiment of the second form of the invention, the effective length of the resistance element 222d (with a layer resistance of about 60 $\Omega/\square$) crossing on one wiring pitch (0.9 µm) of the N⁺-type polysilicon film pattern 211d is about 2.31 µm, therefore the occupied area necessary for a resistance element of 5MΩ is about 50×1000 µm². The interval of the N⁺-type polysilicon film pattern 211d (width of the groove 212d) as the first required interval is defined by the thickness of the silicon dioxide film 215, the silicon dioxide film spacer 221d and the resistance element 222d. Also, the reduction ratio in occupied area of the resistance element is defined by the line width and interval of the N⁺-type polysilicon film pattern 211d, the thickness of the N⁺-type polysilicon film pattern 211d and the depth of the groove 212d, and the thickness of the silicon dioxide film spacer 221d.

Second, the effect as to the reduction in occupied area of the capacitance element as the further object of the invention is as follows:

In the first embodiment of the second form of the invention, the effective length about one wiring pitch (0.8 µm) of the N⁺-type polysilicon film pattern 211e is about 2.21 µm. Taking the gate oxide film of, e.g., 7 nm, the specific inductivity ($\epsilon_S$=3.9) of the silicon dioxide film and the specific inductivity ($\epsilon_S$=7.5) of the silicon nitride film in the capacitive insulating film of the conventional capacitance element into account, the occupied area of the capacitance element in the first embodiment is about 100×3280 µm², while the occupied area of the conventional capacitance element of 3000 pF is about 100×6100 µm². This effect as to the reduction in occupied area of the capacitance element is obtained by adopting the structure composed of the first N⁺-type polysilicon film pattern 211d and the first groove 212d that can greatly help reducing the occupied area of the capacitance element, further by utilizing that the gate electrode is of polycide film. The minimum value of the interval (interval of the grooves 212e) of the N⁺-type polysilicon film patterns 211e as the second required interval is defined by the thickness of the silicon nitride film and the formation process of the tungsten silicide film. In the first embodiment of the second form of the invention, the minimum value can be about 0.2 µm (as the minimum design size). In this case, the silicon dioxide film 221 is little left on the silicon dioxide film cap 218e. With such a minimum value, the occupied area of the capacitance element can be further reduced.

Meanwhile, the second form of the invention is not limited to a semiconductor device including DRAM with stacked type memory cells and a semiconductor device fabricated along the 0.2 µm design rule. Also, the metal silicide film, insulating film cap and insulating film spacer composing the metal polycide film are not limited to the tungsten silicide film, silicon dioxide film cap and silicon dioxide film spacer. For example, as the metal silicide film, molybdenum silicide ($MoSi_2$) film, tantalum silicide ($TaSi_2$) film or titanium silicide ($TiSi_2$) film may be used. As the insulating film cap and spacer, silicon nitride film cap and spacer may be used. Further, the thickness of the second $N^+$-type polysilicon film etc. is not limited to the above-mentioned value.

Next, referring to FIGS. 13A to 15I as well as FIGS. 9 to 12B, a fabrication process of the semiconductor device in the first embodiment of the second form of the invention will be explained. FIGS. 13A to 13I are schematic cross sectional views showing the fabrication process corresponding to a part cut along the line XB-XB' in FIG. 10A, FIGS. 14A to 14I are schematic cross sectional views showing the fabrication process corresponding to a part cut along the line XIB-XIB' in FIG. 11A, and FIGS. 15A to 15I are schematic cross sectional views showing the fabrication process corresponding to a part cut along the line XIIB-XIIB'.

At first, the N-well 202 is formed in the cell array region 261a on the surface of the p-type silicon substrate 201, and the N-well 203 is formed around the cell array region 261a and in the P-channel MOS transistor region 261c on the p-type silicon substrate 201. Then, the P-well 205 of a depth of about 3 μm is formed in the resistance element region 261d and the capacitance element region 261e on the surface of the p-type silicon substrate 201. The depth of the P-well 205 is defined by the depth of the groove to be formed in the resistance element region 261d and the capacitance element region 261e, the junction depth of the $N^+$-type diffusion layer etc. Then, the p-well 206 is formed on the surface of the N-well 202 in the cell array region 261a on the surface of the p-type silicon substrate 201 and in the N-channel MOS transistor region 261b etc. on the surface of the p-type silicon substrate 201. Then, the field insulating film 207 is formed in the device-separating region on the surface of the p-type silicon substrate 201. Then, the gate oxide film 208 of about 7 nm thick is formed, by thermal oxidation, on the surface of the p-well 206 to compose the cell array region 261a surrounded by the field insulating film 207, the surface of the p-well 206 to compose the N-channel MOS transistor region 261b surrounded by the field insulating film 207, the surface of the n-well 203 to compose the P-channel MOS transistor region 261c surrounded by the field insulating film 207, the device-forming region on the p-well 205 to compose the resistance element region 261d surrounded by the field insulating film 207, and the surface (not shown) of the p-well 205 to compose the capacitance element region 261e surrounded by the filed insulating field 207.

Then, after removing selectively the gate oxide film 208 on the surface of the resistance element region 261d and the capacitance element region 261e, the first $N^+$-type polysilicon film 211 (of $N^+$-type in-situ) of about 100 nm thick including phosphorus as impurity is formed by LPCVD on the entire surface. Then, a photoresist film pattern 271 is formed covering the cell array region 261a, the N-channel MOS transistor region 261b and the P-channel MOS transistor region 261c. By anisotropic-etching using the photoresist film pattern 271 as a mask, the first $N^+$-type polysilicon film pattern 211d with a line width of about 0.2 μm and a interval of about 0.7 μm and the first groove 212d of about 0.7 μm are formed in the resistance element region 261d, and the second $N^+$-type polysilicon film pattern 211e and the second grooves 212e are formed in the capacitance element region 261e [FIGS. 13A, 14A and 15A with FIGS. 9 to 12B].

Then, first tungsten silicide film (not clearly shown) of about 100 nm thick and silicon dioxide film (not clearly shown) (preferably of HTO film) of about 100 nm thick are formed on the entire surface in this order. The formation process of the first tungsten silicide film is selected depending upon the thickness of the tungsten silicide film itself and the width of the groove 212e formed in the capacitance element region 261e. When the width of the groove 212e is smaller than about two times the thickness of the first tungsten silicide film the first tungsten silicide film can be formed by sputtering. When the width of the groove 212e is (to some extent) greater than two times the thickness of the first tungsten silicide film, the first tungsten silicide film, the first tungsten silicide film can be formed by LPCVD that is excellent in uneven-covering characteristic. For such a case, tungsten hexafluoride ($WF_6$) and (a large quantity of) dichlorosilane ($SiCl_2H_2$) can be used as source gas. This is similarly applicable to other metal silicide film. For example, when titanium silicide film is formed by LPCVD, titanium tetrachloride and monosilane ($SiH_4$) can be used as source gas.

Then, using a photoresist film pattern 272 as a mask that does not cover the resistance element region 261d and covers most of the capacitance element region 261e, the silicon dioxide film (formed on the first tungsten silicide film), the first tungsten silicide film and the $N^+$-type polysilicon film 211 are anisotropic-etched. Thereby, the silicon dioxide film caps 218a, 218b, 218c, 218e etc., word line 217a, gate electrode 217b, 217c etc., and opposed electrode 216e of the first tungsten silicide film pattern are formed. The word line 217a is composed of the $N^+$-type polysilicon film pattern 211a and the tungsten silicide film pattern 216a to be laminated thereon. The gate electrode 217b is composed of the $N^+$-type polysilicon film pattern 211b and the tungsten silicide film pattern 216b to be laminated thereon. The gate electrode 217c is composed of the $N^+$-type polysilicon film pattern 211c and the tungsten silicide film pattern 216c to be laminated thereon [FIGS. 13C, 14C and 15C with FIGS. 9 to 12B].

Then, after removing the photoresist film pattern 272, the ion implantation of phosphorus is conducted using a photoresist film pattern 273 as a mask to cover the resistance element region 261d and the capacitance element region 261e. Thereby, the $N^-$-type diffusion layers 219aa, 219ab self-aligned to the word line 217a are formed on the surface of the P-well 206 composing the cell array region 261a, and the $N^-$-type diffusion layer 219b self-aligned to the gate electrode 217b are formed on the surface of the P-well 206 composing the N-channel MOS transistor region 261b [FIGS. 13D, 14D and 15D with FIGS. 9 to 12B].

Then, after removing the photoresist film pattern 273, the second silicon dioxide film 221 of about 60 nm thick is formed on the entire surface. The silicon dioxide film 221 is preferably of HTO film (LPCVD). Then, a photoresist film pattern 274 is formed to cover the N-channel MOS transistor region 261b and the P-channel MOS transistor region 261c and not to cover the resistance element region 261d, capacitance element region 261e and cell array region 261a. By anisotropic-etching using the photoresist film pattern as a mask, the silicon dioxide film 221 is etched back. Thereby, the silicon dioxide film spacer 221a is formed on the side of the word line 217a in the cell array region 261a. Also, the silicon dioxide film spacer 221d is formed covering the side of the $N^+$-type polysilicon film pattern 211d and the groove 212d through the silicon dioxide film 215 in the resistance element region 261d. Also, the silicon dioxide film spacer 221e is formed covering the side of the opposed electrode 216e (and the silicon dioxide film cap 218e) in the capacitance element region 261e. Further, the silicon dioxide film 221 is partially left on the top surface of the silicon dioxide film cap 218e located over the groove 212e [FIGS. 13E, 14E and 15E with FIGS. 9 to 12B].

Then, after removing the photoresist film pattern 274, a second N$^+$-type polysilicon film 222 of about 150 nm thick (at its flat part) is formed on the entire surface. N-type impurity included in the N$^+$-type polysilicon film 222 is also phosphorus. The second N$^+$-type polysilicon film 222 is preferably to be N$^+$-type in the film-forming stage (in-situ) because it needs to have an uneven-covering characteristic and to function as a diffusion source. Therefore, the second N$^+$-type polysilicon film is preferably formed by LPCVD. Alternatively, amorphous silicon film including high-concentration phosphorus in-situ may be formed by LPCVD. Then, by anisotropic-etching using the photoresist film pattern 275 as a mask to cover the cell array region 261a, the first-stage patterning of the second N$^+$-type polysilicon film 222 is conducted. Thereby, the resistance element 222d is formed [FIGS. 13F, 14F and 15F with FIGS. 9 to 12B].

Then, after removing the photoresist film pattern 275, a photoresist film pattern 276 is formed to cover at least the resistance element region 261d. By using the photoresist film pattern 276 as a mask, the second-stage patterning of the N$^+$-type polysilicon film 222 (left in the cell array region 261a) is conducted. Thereby, the extraction pads 222aa, 222ab are formed [FIGS. 13G, 14G and 15G with FIGS. 9 to 12B].

In both the first- and second-stage patterning to the N$^+$-type polysilicon film 222, the mixture gas of hydrogen bromide (HBr) and chlorine (Cl$_2$) is used as etching gas. Though the thickness of the N$^+$-type polysilicon film 222 to form the resistance element 222d is almost uniform, the aspect ratio of the groove 212d is not negligible. On the other hand, the thickness of the N$^+$-type polysilicon film 222 to form the extraction pads 222aa, 222ab is in the range of about 150 nm to 450 nm because the space between the word lines 217a is filled therewith. Therefore, it is not suitable that both the films are formed by one patterning. Meanwhile, it is desirable that the flow ratio of chlorine gas in the first-stage patterning is increased (with enhancing the isotropic-etching to some extent) a little higher than that in the second-stage patterning.

Then, after removing the photoresist film pattern 276, a rapid thermal processing is conducted, like the first embodiment of the first form of the invention. By this thermal processing, the N$^+$-type diffusion layers 223aa, 223ab (the N-type source/drain regions 224aa, 224ab of N-channel MOS transistor to compose the memory cell) are formed just under the extraction pads 222aa, 222ab. Subsequently, a photoresist film pattern 277 is formed covering the cell array region 261a, P-channel MOS transistor region 261c, resistance element 261d and capacitance element region 261e. By anisotropic-etching using the photoresist film pattern 277 as a mask, the silicon dioxide film 221 is etched back, thereby the silicon dioxide film spacer 221b is formed. Further, by ion-implanting arsenic using the photoresist film pattern 277 as a mask, the N$^+$-type diffusion layer 223b is formed. Thereby, the N-type source/drain region 224b (composed of the N$^+$-type diffusion layer 223b and the N$^-$-type diffusion layer 219b) of the N-channel MOS transistor in the N-channel MOS transistor region 261b is formed, thus the formation of the N-channel MOS transistor itself is completed [FIGS. 13H, 14H and 15H with FIGS. 9 to 12B].

Then, after removing the photoresist film pattern 277, a photoresist film pattern 278 with an aperture only at the P-channel MOS transistor region 261c is formed, like the first embodiment of the first form of the invention. By anisotropic-etching using the photoresist film pattern 278 as a mask, the silicon dioxide film 221 is etched back, thereby the silicon dioxide film spacer 221c is formed. Further, by ion-implanting boron difluoride (BF$_2$) using the photoresist film pattern 278 as a mask, the P-type source/drain region 225 of P$^+$-type diffusion layer is formed. Thereby, the formation of the P-channel MOS transistor in the P-channel MOS transistor region 261c is completed [FIGS. 13I, 14I and 15I with FIGS. 9 to 12B].

Then, the photoresist film pattern 278 is removed. Thereafter, the first interlayer insulating film 231 is formed on the entire surface, like the first embodiment of the first form of the invention. Then, the bit contact hole 232 and the bit line 234 are formed. Further, the second interlayer insulating film 241 is formed on the entire surface. Then, the node contact hole 242 and the contact plug 243 are formed. Further, the storage node electrode 244, the capacitive insulating film 245, the cell plate electrode 246 and the third interlayer insulating film 251 are formed. Thereby, the semiconductor device in the first embodiment of the second form of the invention is obtained [FIGS. 9 to 12B].

Meanwhile, the composition of the resistance element according to the second form of the invention is not limited to that in the first embodiment described above.

Figure 16A:
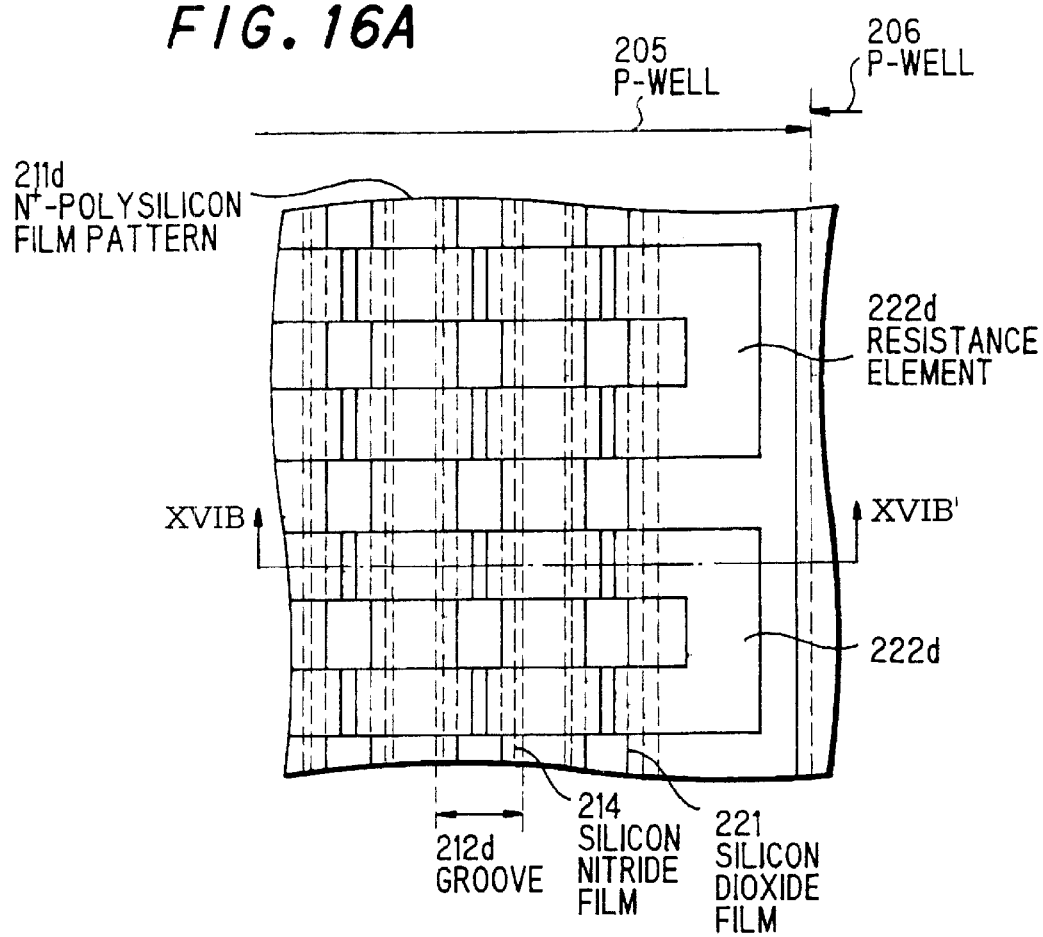
FIG. 16A is a partial plan view showing a semiconductor device in a second preferred embodiment of the second preferred form of the invention.
Figure 16B:
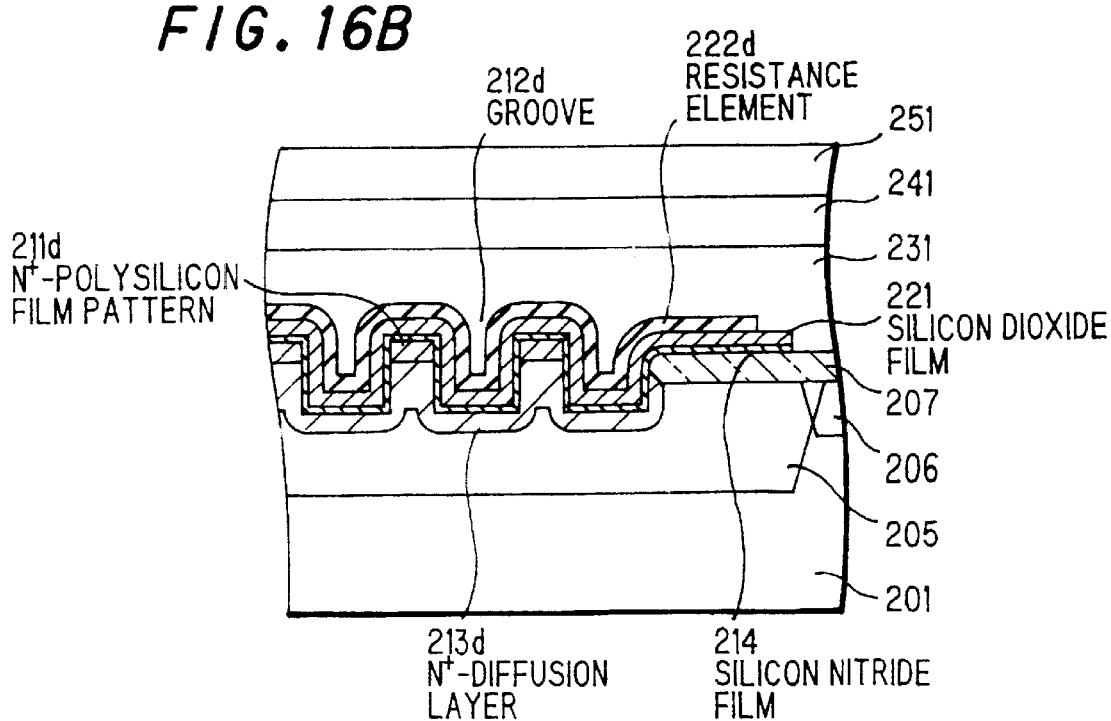
FIG. 16B is a cross sectional view cut along the line XVIB–XVIB' in FIG. 16A.

Next, referring to FIGS. 16A and 16B, a semiconductor device in the second preferred embodiment of the second form of the invention will be explained below. FIG. 16A is a partial plan view showing the semiconductor device in the second preferred embodiment of the second form of the invention, and FIG. 16B is a schematic cross sectional view cut along the line XVIB-XVIB' in FIG. 16A. In the second embodiment of the second form, the resistance element region 261d in the from that in the first embodiment of the second form of the invention.

The composition of the resistance element region 261d in the second embodiment of the second form will be explained below.

The side and top surface of the N$^+$-type polysilicon film pattern 211d and the surface of the groove 212d are covered with the silicon nitride film 214 (as the first capacitive insulating film) of about 20 nm thick and the silicon dioxide film 221 (which is the same layer as the silicon dioxide film spacer) of about 60 nm thick. Because of this, in the second embodiment, the interval of the N$^+$-type polysilicon film patterns 211d (width of the groove 212d) has only to be about 0.5 μm. Thus, the occupied area of the resistance element in the second embodiment of the second form can further reduced, compared with that in the first embodiment of the second form.

The reduction in occupied area of the resistance element, which corresponds to the main object of the invention, can be attained as follows: while providing the parallel and uneven structure formed on or above the surface of the silicon substrate and covering the uneven structure with the insulating film, the resistance element with conductive film pattern is formed in the orthogonal direction to the uneven structure on the surface of the insulating film. Thus, the effective length of the resistance element can be lengthened. Thereby, the occupied area of the resistance element can be easily reduced. In the first form of the invention, the uneven structure can be provided by forming the dummy gate electrode of polycide film on the field insulating film. In the second form of the invention, the uneven structure can be provided by forming the first polysilicon film pattern to compose the lower layer of the polycide film and the grooves formed self-aligned to the first polysilicon film pattern on the (p-type) silicon substrate (P-well).

Also, the reduction in occupied area of the capacitance element, which corresponds to the further object of the invention, can be attained by using the uneven structure according to the second form of the invention. Namely, one electrode of the capacitance element is given by forming the reverse conductivity type high-concentration diffusion layer with the uneven structure composed of the silicon substrate or exposed well, and the opposed electrode is given by covering the uneven structure with capacitive insulating film and further covering the capacitive insulating film with the metal silicide film to compose the upper layer of the polycide film.

Although the invention has been described with respect to specific embodiments for complete and clear disclosure, the appended claims are not to be thus limited but are to be construed as embodying all modifications and alternative constructions that may occur to one skilled in the art which fairly fall within the basic teaching set forth herein.

What is claimed is:

1. A semiconductor device, comprising:
    a N-channel MOS transistor formed on the surface of a first P-well formed on the surface of a P-type silicon substrate;
    a P-channel MOS transistor formed on the surface of a N-well formed on the surface of said P-type silicon substrate; and
    a resistance element formed on the surface of a second P-well formed on the surface of said P-type silicon substrate while having a depth deeper than that of said first P-well;
    wherein said N-channel MOS transistor and said P-channel MOS transistor have a gate electrode composed of a first $N^+$-type polysilicon film and a metal silicide film to be laminated thereon, the top surface of said gate electrode being covered with an insulating film cap of a first insulating film and the side of said gate electrode being covered with an insulating film spacer of a second insulating film;
    said semiconductor device further comprises a plurality of $N^+$-type polysilicon film patterns that are composed of said first $N^+$-type polysilicon film and are formed in parallel at predetermined intervals on said second P-well while directly connecting to the surface of said second P-well, a groove with a predetermined depth formed self-alignedly to said $N^+$-type polysilicon film patterns on said second P-well, and a $N^+$-type diffusion layer is formed on the surface of said second P-well to form the surface of said groove as well as the surface of said P-well to be directly connected to said $N^+$-type polysilicon film patterns;
    the surface of said $N^+$-type polysilicon film patterns including said groove is covered with a third insulating film with a predetermined thickness; and
    said resistance element composed of a second $N^+$-type polysilicon film is formed reciprocative-crossing several times in the orthogonal direction to said $N^+$-type polysilicon film patterns through said third insulating film on said $N^+$-type polysilicon film patterns.

2. A semiconductor device, according to claim 1, wherein: said first, second and third insulating films are of a silicon dioxide film.

3. A semiconductor device, according to claim 2, wherein:
    said semiconductor device further comprises: DRAM with a stacked type memory cell, said memory cell being composed of said N-channel MOS transistor formed as a second N-channel MOS transistor including a word line composed of said gate electrode;
    a second N-well with a depth deeper than that of said N-well is formed on said P-type silicon substrate, said first P-well being formed on said second N-well surrounded by said N-well and said second N-channel MOS transistor being formed on said first P-well; and
    an extraction pad composed of said second $N^+$-type polysilicon film, said extraction pad being connected directly with a N-type source/drain region of said second N-channel MOS transistor self-alignedly to said insulating film spacer formed on the side of said word line and connected with a bit line or a storage node electrode.

4. A semiconductor device, according to claim 3, wherein said resistance element and said extraction pad each comprise a different thickness of said second $N^+$-type polysilicon film.

5. A semiconductor device, according to claim 1, wherein:
    said third insulating film is composed of a silicon nitride film and said second insulating film to be laminated thereon, and
    said first and second insulating films are of a silicon dioxide film.

6. A semiconductor device, according to claim 5, wherein:
    said semiconductor device further comprises: DRAM with a stacked type memory cell, said memory cell being composed of said N-channel MOS transistor formed as a second N-channel MOS transistor including a word line composed of said gate electrode;
    a second N-well with a depth deeper than that of said N-well is formed on said P-type silicon substrate, said first P-well being formed on said second N-well surrounded by said N-well and said second N-channel MOS transistor being formed on said first P-well; and
    an extraction pad composed of said second $N^+$-type polysilicon film, said extraction pad being connected directly with a N-type source/drain region of said second N-channel MOS transistor self-alignedly to said insulating film spacer formed on the side of said word line and connected with a bit line or a storage node electrode.

7. A semiconductor device, according to claim 6, wherein said resistance element and said extraction pad each comprise a different thickness of said second $N^+$-type polysilicon film.

8. A semiconductor device, comprising:
    a N-channel MOS transistor formed on the surface of a first P-well formed on the surface of a P-type silicon substrate;
    a P-channel MOS transistor formed on the surface of a N-well formed on the surface of said P-type silicon substrate;
    a resistance element formed on the surface of a second P-well formed in a first region of the surface of said P-type silicon substrate while having a depth deeper than that of said first P-well; and a capacitance element formed on the surface of said second P-well formed in a second region of the surface of said P-type silicon substrate while having a depth deeper than that of said first P-well;

wherein said N-channel MOS transistor and said P-channel MOS transistor have a gate electrode composed of a first $N^+$-type polysilicon film and a metal silicide film to be laminated thereon, the top surface of said gate electrode being covered with an insulating film cap of a first insulating film and the side of said gate electrode being covered with an insulating film spacer of a second insulating film;

said semiconductor device further comprises a plurality of first $N^+$-type polysilicon film patterns that are composed of said first $N^+$-type polysilicon film and are formed in parallel at first predetermined intervals on said second P-well in said first region while directly connecting to the surface of said second P-well, a first groove with a predetermined depth formed self-alignedly to said first $N^+$-type polysilicon film patterns on said second P-well, and a first $N^+$-type diffusion layer is formed on the surface of said second P-well to form the surface of said first groove as well as the surface of said P-well to be directly connected to said $N^+$-type polysilicon film patterns;

the surface of said first $N^+$-type polysilicon film patterns including said first groove is covered with a third insulating film with a predetermined thickness; and said resistance element composed of a second $N^+$-type polysilicon film is formed reciprocative-crossing several times in the orthogonal direction to said first $N^+$-type polysilicon film patterns through said third insulating film on said $N^+$-type polysilicon film patterns;

said semiconductor device further comprises a plurality of second $N^+$-type polysilicon film patterns that are composed of said first $N^+$-type polysilicon film and are formed in parallel at second predetermined intervals on said second P-well in said second region while directly connecting to the surface of said second P-well, a second groove with a predetermined depth formed self-alignedly to said second $N^+$-type polysilicon film patterns on said second P-well, and a second $N^+$-type diffusion layer is formed on the surface of said second P-well to form the surface of said second groove as well as the surface of said second P-well to be directly connected to said second $N^+$-type polysilicon film patterns; and the surface of said second $N^+$-type polysilicon film patterns including said second groove is covered with a capacitive insulating film, said capacitive insulating film further being directly covered with an opposed electrode composed of said metal silicide film.

9. A semiconductor device, according to claim 8, wherein:

said first, second and third insulating films are of a silicon dioxide film.

10. A semiconductor device, according to claim 9, wherein:

said semiconductor device further comprises: DRAM with a stacked type memory cell, said memory cell being composed of said N-channel MOS transistor formed as a second N-channel MOS transistor including a word line composed of said gate electrode;

a second N-well with a depth deeper than that of said N-well is formed on said P-type silicon substrate, said first P-well being formed on said second N-well surrounded by said N-well and said second N-channel MOS transistor being formed on said first P-well; and an extraction pad composed of said second $N^+$-type polysilicon film, said extraction pad being connected directly with a N-type source/drain region of said second N-channel MOS transistor self-alignedly to said insulating film spacer formed on the side of said word line and connected with a bit line or a storage node electrode.

11. A semiconductor device, according to claim 10, wherein said resistance element and said extraction pad each comprise a different thickness of said second $N^+$-type polysilicon film.

12. A semiconductor device, according to claim 8, wherein:

said third insulating film is composed of said capacitive insulating film and said second insulating film to be laminated thereon, and said first and second insulating films are of a silicon dioxide film.

13. A semiconductor device, according to claim 12, wherein:

said semiconductor device further comprises: DRAM with a stacked type memory cell, said memory cell being composed of said N-channel MOS transistor formed as a second N-channel MOS transistor including a word line composed of said gate electrode;

a second N-well with a depth deeper than that of said N-well is formed on said P-type silicon substrate, said first P-well being formed on said second N-well surrounded by said N-well and said second N-channel MOS transistor being formed on said first P-well; and an extraction pad composed of said second $N^+$-type polysilicon film, said extraction pad being connected directly with a N-type source/drain region of said second N-channel MOS transistor self-alignedly to said insulating film spacer formed on the side of said word line and connected with a bit line or a storage node electrode.

14. A semiconductor device, according to claim 13, wherein said resistance element and said extraction pad each comprise a different thickness of said second $N^+$-type polysilicon film.

* * * * *